US006962836B2

(12) United States Patent
Miyaki et al.

(10) Patent No.: US 6,962,836 B2
(45) Date of Patent: Nov. 8, 2005

(54) METHOD OF MANUFACTURING A SEMICONDUCTOR DEVICE HAVING LEADS STABILIZED DURING DIE MOUNTING

(75) Inventors: Yoshinori Miyaki, Tachikawa (JP); Hiromichi Suzuki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 87 days.

(21) Appl. No.: 10/644,919

(22) Filed: Aug. 21, 2003

(65) Prior Publication Data

US 2004/0089923 A1 May 13, 2004

Related U.S. Application Data

(62) Division of application No. 09/978,708, filed on Oct. 18, 2001, now Pat. No. 6,661,081.

(30) Foreign Application Priority Data

Oct. 20, 2000 (JP) ....................................... 2000-320794

(51) Int. Cl.[7] .......................... H01L 21/48; H01L 21/44
(52) U.S. Cl. ........................ 438/123; 438/124; 438/617
(58) Field of Search ................................ 438/123, 112, 438/124, 127, 617, 612, 666, 618

(56) References Cited

U.S. PATENT DOCUMENTS

| | | | | |
|---|---|---|---|---|
| 5,068,708 A | | 11/1991 | Newman | |
| 5,177,032 A | * | 1/1993 | Fogal et al. | 228/175 |
| 5,304,844 A | | 4/1994 | Horiuchi et al. | |
| 5,457,340 A | | 10/1995 | Templeton et al. | |
| 5,650,663 A | | 7/1997 | Parthasarathi | |
| 6,404,067 B1 | | 6/2002 | Singh et al. | |

FOREIGN PATENT DOCUMENTS

| | | |
|---|---|---|
| JP | 5-36862 | 2/1993 |
| JP | 5-160304 | 6/1993 |
| JP | 5-235246 | 9/1993 |
| JP | 6-291217 | 10/1994 |
| JP | 7-153890 | 6/1995 |
| JP | 8-116012 | 5/1996 |
| JP | 11-289040 | 10/1999 |
| JP | 11-514149 | 11/1999 |
| JP | 2000-252404 | 9/2000 |
| WO | WO09/02600 | 1/1997 |

* cited by examiner

*Primary Examiner*—Long Pham
*Assistant Examiner*—DiLinh Nguyen
(74) *Attorney, Agent, or Firm*—Mattingly, Stanger & Malur, P.C.

(57) ABSTRACT

A semiconductor device comprises a plurality of inner leads extending around a semiconductor chip, a tape substrate supporting the semiconductor chip and joined to respective end portions of the inner leads, wires connecting the inner leads and pads formed on a main surface of the semiconductor chip, a seal portion formed by resin-sealing the semiconductor chip and the wires, and a plurality of outer leads linking in a line with the inner leads and protruded from the seal portion to the exterior of four directions. A relationship between a length (a) of a shorter side of the semiconductor chip and a clearance (b) from the semiconductor chip, to a tip of the inner leads arranged at the farthest location from the semiconductor chip is $a \leqq 2b$. It is possible to attain a narrow pad pitch, and mount the semiconductor chip formed in a small size, and standardize the lead frame.

5 Claims, 28 Drawing Sheets

METHOD OF MANUFACTURING A SEMICONDUCTOR DEVICE HAVING LEADS STABILIZED DURING DIE MOUNTING

This is a divisional application of U.S. Ser. No. 09/978,708, filed Oct. 18, 2001, now U.S. Pat. No. 6,661,081.

BACKGROUND OF THE INVENTION

The present invention relates to a semiconductor manufacturing technique, and in particular, to an effective technique applied to enhancement of the reliability of semiconductor devices having small semiconductor chips arranged at narrow pad pitches.

In Japanese Patent Laid-Open No. 8-116012, No. 5-160304, No. 5-36862, No. 11-289040, No. 11-514149, No. 7-153890, No. 6-291217 and No. 5-235246, there are disclosed techniques for fixing inner leads to metal sheets and ceramic sheets via adhesives or the like.

Firstly, in Japanese Patent Laid-Open No. 8-116012, there is disclosed a resin-sealing type semiconductor device in which an aluminum sheet is used as a heat radiation plate and the inner lead is fixed to the aluminum sheet via adhesives by providing an insulation layer on a surface of the aluminum sheet. There are described objects of improving heat-radiating properties, reducing material cost, and shortening manufacturing time.

In Japanese Patent Laid-Open No. 5-160304, there is disclosed a semiconductor device having a construction in which an aluminum sheet is used as a heat radiation plate and leads are affixed to the aluminum sheet via adhesives as an object of improving heat properties.

In Japanese Patent Laid-Open No. 5-36862, there is disclosed a semiconductor device having a construction in which a ceramic sheet is affixed to inner leads. Heat generated from semiconductor chips is discharged into the exterior thereof through ceramic sheets and inner leads to thereby improve heat-radiating properties of the semiconductor device.

In Japanese Patent Laid-Open No. 11-289040, there are disclosed lead frames to which inner leads are joined at one surface of a heat radiation plate through an electrical insulation layer and adhesive layer, and a semiconductor device using these lead frames. There are described objects of improving the quality and reducing the manufacturing cost thereof.

In Japanese Patent Laid-Open No. 11-514149, there is disclosed an electronic package having a construction in which semiconductor chips and leads are fixed to a heat slug, on the surface of which electric insulating anode treated coating is provided. There is described an object of improving the heat properties thereof.

In Japanese Patent Laid-Open No. 7-153890, there is disclosed a lead frame for a semiconductor device in which inner leads are fixed to heat radiation plates via adhesives, the heat radiation plates each comprising a metal sheet on which insulation treatment is treated. There are described objects of attaining improvement of heat radiating properties, high speed of signal processing, and long life of the semiconductor device by this lead frame.

In Japanese Patent Laid-Open No. 6-291217, there is disclosed a heat-dissipation type lead frame in which a ceramic sheet is used as a heat radiation plate and inner leads are fixed to this ceramic plate via adhesives. There are described objects of not only suppressing residual stress generated by heat but also preventing a shape of the frame from being deformed at the manufacturing stages thereof when this lead frame has a package structure.

In Japanese Patent Laid-Open No. 5-235246, there is disclosed a semiconductor device of a construction in which a main surface of each semiconductor chip is fixed to one surface of an insulation tape via adhesives, and each inner lead is fixed to the other surface via the adhesives, and each semiconductor chip surface electrode is exposed from each hole of a insulation tape to connect the inner leads and the surface electrodes via said holes by wires. There are described objects of increasing the degree of design freedom of chips and attaining high speed of signal transmission.

SUMMARY OF THE INVENTION

However, techniques described in the above-mentioned seven Japanese Patent Laid-Open references except for Japanese Patent Laid-Open No. 5-235246 have objects of improving heat radiation properties thereof by using metal sheets or ceramic sheets, and do not disclose the concept that a technique for fixing inner leads to metal sheets or ceramic sheets via adhesives is used for semiconductor devices having many pins and narrow pad pitches.

In addition, in Japanese Patent Laid-Open No. 5-235246, there is disclosed a technique for fixing inner leads to an insulation tape. But, in the construction (the construction in which the main surface of the semiconductor chip is fixed to one surface of the insulation tape, and the inner lead is fixed in the other surface thereof, and the pads of the semiconductor chip are exposed from the holes of the insulation tape to connect the inner leads and pads via said holes by the wires) described therein, there arise problems of decrease in the tape area on each chip and in area for forming the holes in the insulating tape if the semiconductor chip becomes small and has many pins.

Consequently, there arises a problem of difficulty in attaining a structure having small chips and many pins on the basis of the structure disclosed in Japanese Patent Laid-Open No. 5-235246.

Furthermore, in the construction disclosed in Japanese Patent Laid-Open No. 5-235246, since holes must be formed in the insulation tape, the insulation tape having a size fitted to the chip size is required and lead frame to which this insulation tape is affixed must be prepared. And so, there arises a problem of no attainment of standardization of the lead frame.

Accordingly, an object of the present invention is to provide a semiconductor device and a manufacturing method thereof which are capable of achieving narrow pad pitches and improvement of the reliability.

Another object of the present invention is to provide a semiconductor device and a manufacturing method thereof that allow the lead frame to be standardized.

The above-mentioned and other objects and new features of the present invention will become apparent from the detailed description of the present specification and the accompanied drawings.

Of the inventions to be disclosed in the present application, outlines of typical inventions will be briefly described as follows.

That is, the semiconductor device that is the present invention comprises a plurality of inner leads extending around a semiconductor chip; a thin sheet-shaped insulating member supporting said semiconductor chip and joined to an end portion of said respective inner leads; a bonding wire for connecting surface electrodes of said semiconductor chip and said inner leads corresponding thereto; a seal portion formed by resin-sealing said semiconductor chip, said wire and said insulating member; and a plurality of outer leads linked to said inner leads and exposed from said seal portion, wherein a length of a shorter side of a main surface of said semiconductor chip formed in a quadrilateral shape is twice or less than a distance from a tip of the inner leads arranged at the farthest location from a center line of the semiconductor chip in a plane direction, to said semiconductor chip.

According to the present invention, it is possible to certainly have effects on suppression of wire flow caused by flow of mold resin, and of flapping of the inner leads, by fixing the inner leads to the insulating member.

As a result, it is possible to improve reliability of the semiconductor device having a construction in which the inner leads are joined to the insulating member.

Further, it is possible to mount the semiconductor chip to the insulating member even if a chip becomes small in size, and it is no longer necessary to prepare the lead frame per size of a chip. As a result, standardization of the lead frame can be attained.

In addition, the semiconductor device that is the present invention comprises a plurality of inner leads extending around a semiconductor chip; a thin sheet-shaped insulating member supporting said semiconductor chip and joined to an end portion of said respective inner leads; a bonding wire for connecting surface electrodes of said semiconductor chip and said inner leads corresponding thereto; a seal portion formed by resin-sealing said semiconductor chip, said wire and said insulating member; and a plurality of outer leads linked to said inner leads and exposed from said seal portion, wherein a length of a shorter side of a main surface of said semiconductor chip formed in a quadrilateral shape is longer than a distance from a tip of the inner leads arranged at the farthest location from a center line of the semiconductor chip in a plane direction, to said semiconductor chip, and is twice or less than this distance.

Further, the semiconductor device that is the present invention comprises a plurality of inner leads extending around a semiconductor chip; a thin sheet-shaped insulating member supporting said semiconductor chip and joined to an end portion of said respective inner leads; an adhesive layer for joining said inner leads and said insulating member; a bonding wire for connecting surface electrodes of said semiconductor chip and said inner leads corresponding thereto; a seal portion formed by resin-sealing said semiconductor chip, said wire and said insulating member; and a plurality of outer leads linked to said inner leads and exposed from said seal portion.

According to the present invention, it is possible to suppress wire flow caused by flow of mold resin and/or flapping of the inner leads. As a result, a narrow pad pitch of the inner leads can be attained.

Further, it is possible to suppress expansion and shrinkage of respective tips of the inner leads at the time of solder reflow generated by thermal expansion coefficient differences between mold resin and the inner leads.

This can prevent disconnection generated in joining portions between the wires and the inner leads. As a result, reliability of the semiconductor device can be improved.

Moreover, in the semiconductor device that is the present invention, the semiconductor chip is thicker than a total of the insulating member and the adhesive layer in thickness.

According to the present invention, since thickness of the insulating member can be made thin, the thermal conduction can be improved at the time of die bonding.

In addition, since the thickness of the insulating member can be made thin, the semiconductor device can be formed in a thin shape. This can reduce material cost thereof, and attain low cost of semiconductor device.

The manufacturing method of a semiconductor device that is the present invention comprises the steps of: preparing a multi-link lead frame formed by linking in a line with a plurality of package areas, each of the package areas including a plurality of inner leads, a thin sheet-shaped insulating member joined to an end portion of each of said inner leads and capable of supporting a semiconductor chip; mounting said semiconductor chip on said insulating member in each of said package area; connecting surface electrodes of said semiconductor chips and said inner leads corresponding thereto by a wire; forming a seal portion by resin-sealing said semiconductor chips, said wire, and said insulating member; and separating a plurality of outer leads exposed from said seal portion, from a frame section of said lead frame.

Further, the manufacturing method of a semiconductor device that is the present invention comprises the steps of: preparing a matrix frame formed by arranging a plurality of package areas in a matrix arrangement, each of the package areas including a plurality of inner leads, a thin sheet-shaped insulating member joined to an end portion of each of said inner leads and capable of supporting a semiconductor chip; mounting said semiconductor chip on said insulating member in each of said package area; connecting surface electrodes of said semiconductor chips and said inner leads corresponding thereto by a wire; forming a seal portion by resin-sealing said semiconductor chips, said wire, and said insulating member; and separating a plurality of outer leads exposed from said seal portion, from a frame section of said matrix frame.

DESCRIPTION OF THE PREFERRED EMBODIMENTS

Figure 1A:
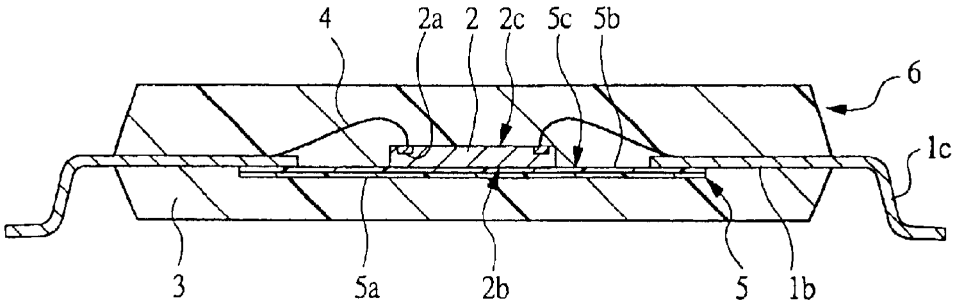
FIG. 1A shows one example of a construction of a semiconductor device that is Embodiment 1 of the present invention, and is a cross-sectional view.

Referring now to the drawings, embodiments of the present invention will be described in detail below.

In the following embodiments, description will be made by dividing into a plurality of sections or embodiments if it is necessary for convenience. But, particularly except for specified cases, a plurality of sections or embodiments has something to do with each other, and one thereof has something to do with a modification, or a detailed or supplementary explanation, or the like of parts or the entire of the other thereof.

Additionally, in the following embodiments, in the case where the number and the like (including the number, numerical value, quantity, range and the like) of elements are mentioned, except the cases particularly specified, cases apparently restricted to the specific number and the like, the embodiments will not be limited to that specific number and may have numbers more than or less than the specific number.

Furthermore, in the following embodiments, it is needless to say that, except for the cases particularly specified, the cases thought to be essential apparently and in principle and the like, the components (including element steps and the like) are not always essential.

Similarly, in the following embodiments, except for the cases particularly, and the cases thought not to be so apparently and in principle and the like, mention of shapes, positional relationships and the like of the components and the like includes substantially ones like approximate or similar to the shapes and the like. Similarly, this is applied to the numerical values and ranges.

In all the drawings for describing the embodiments, the same reference numbers denote components having the same function, and repetitions thereof will be omitted.

(Embodiment 1)

Figure 1B:
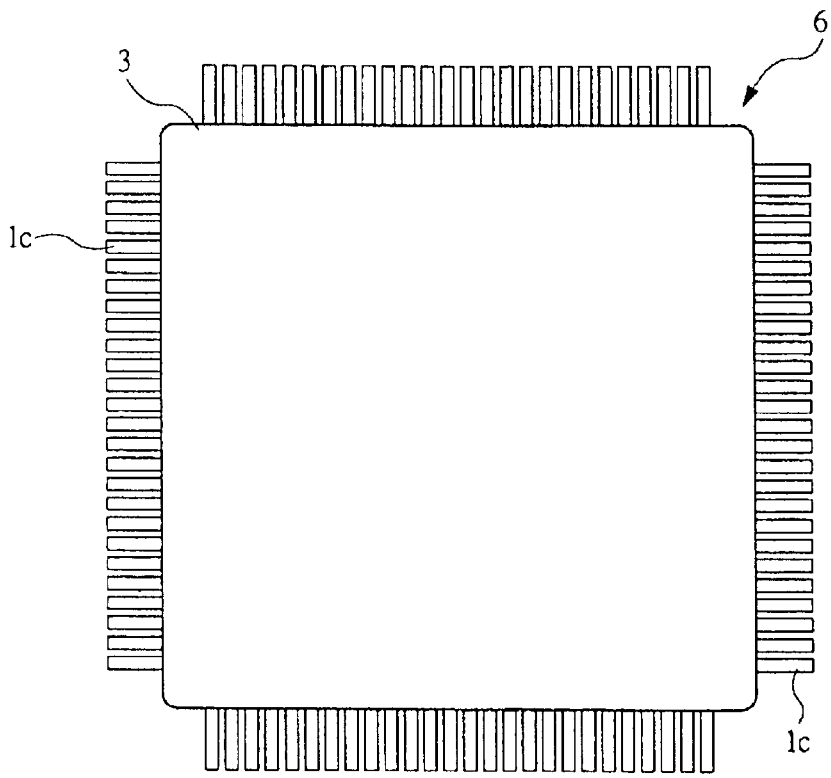
FIG. 1B shows one example of a construction of a semiconductor device that is Embodiment 1 of the present invention, and is a plan view.
Figure 2:
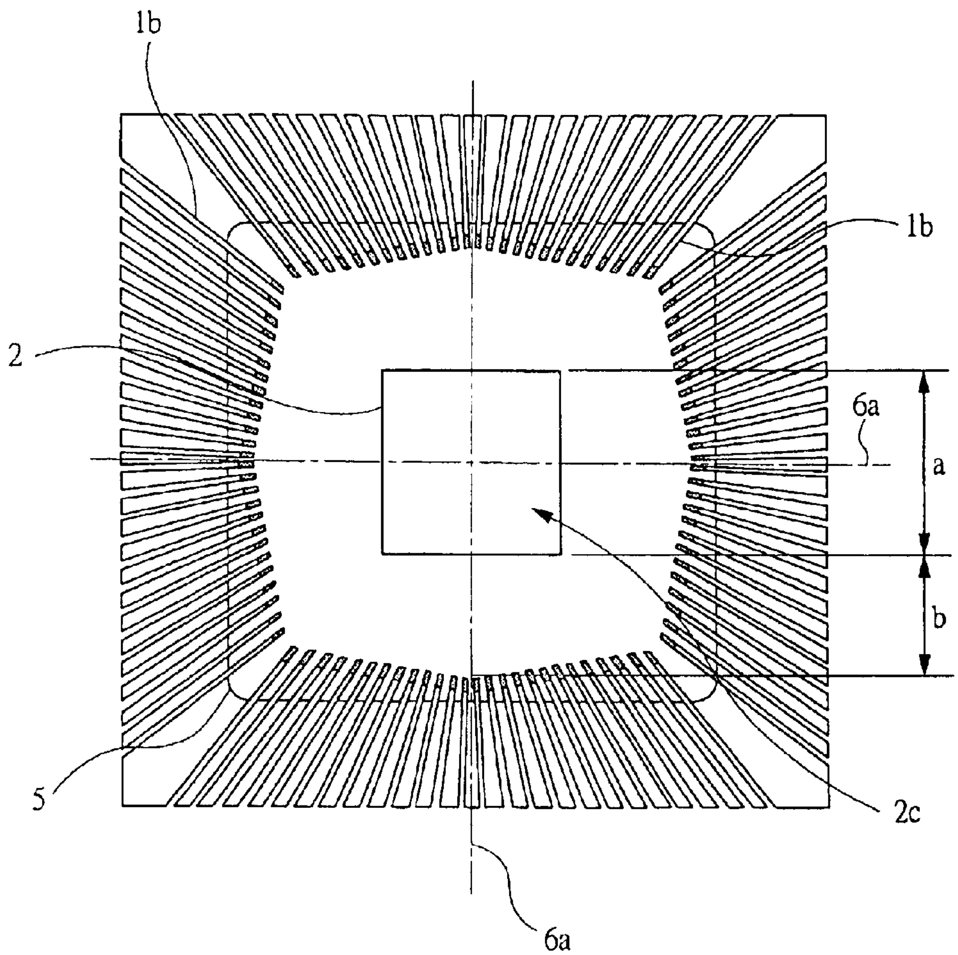
FIG. 2 is a partial plan view showing one example of a distance between a semiconductor chip and each inner lead in the semiconductor device shown in FIG. 1.
Figure 3:
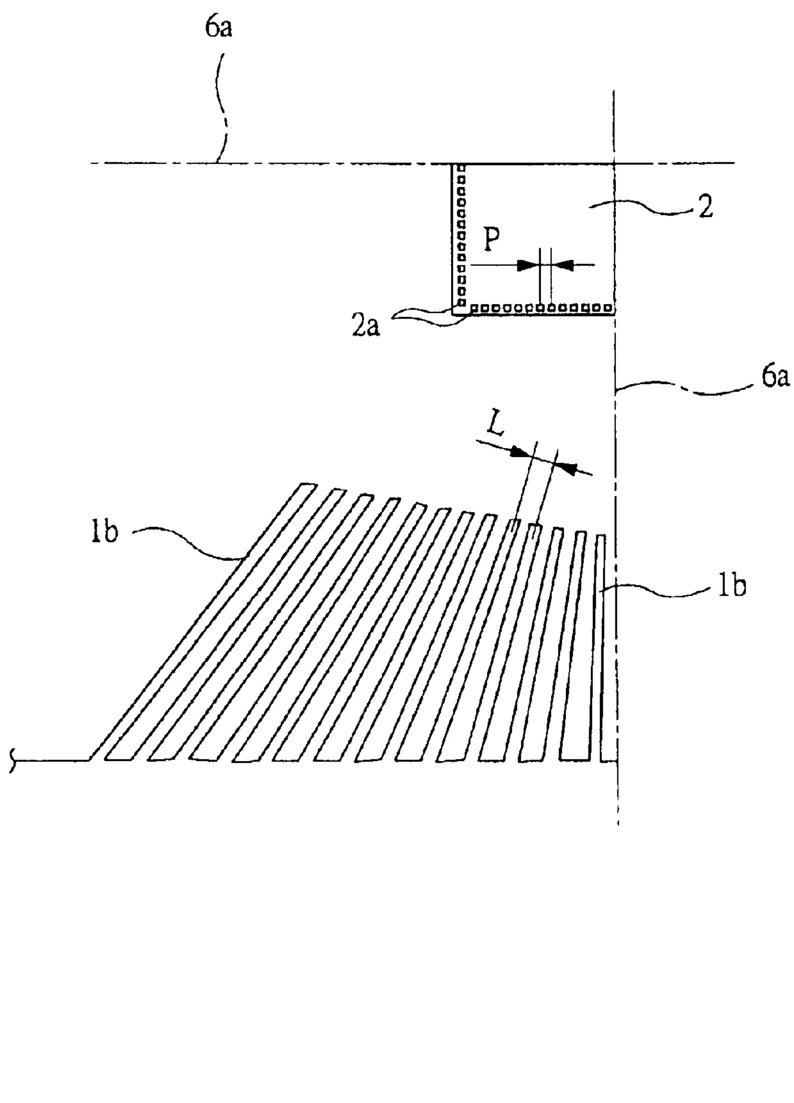
FIG. 3 is a partially enlarged plan view showing one example of a pad pitch and a pitch between the inner leads of a semiconductor chip of the semiconductor device shown in FIG. 1.
Figure 4:
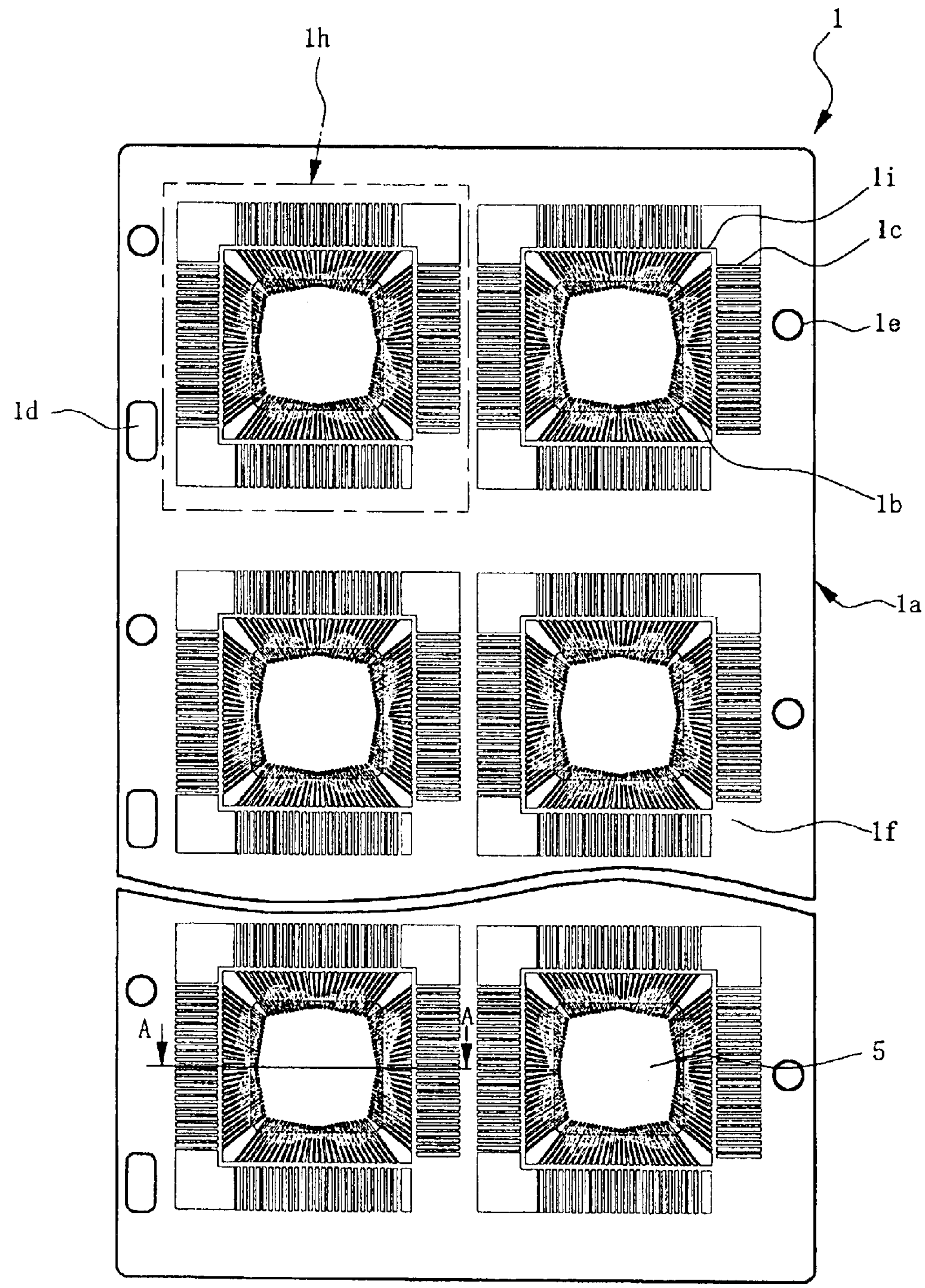
FIG. 4 is a partial plan view shown by partially cutting away one example of a construction of a matrix frame used for assembly of the semiconductor device shown in FIG. 1.
Figure 5:
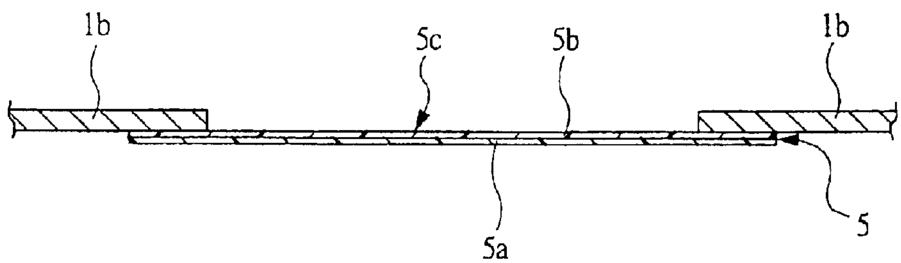
FIG. 5 is a partially enlarged cross-sectional view showing a structure having a cross section taken along line A—A in FIG. 4.
Figure 6:
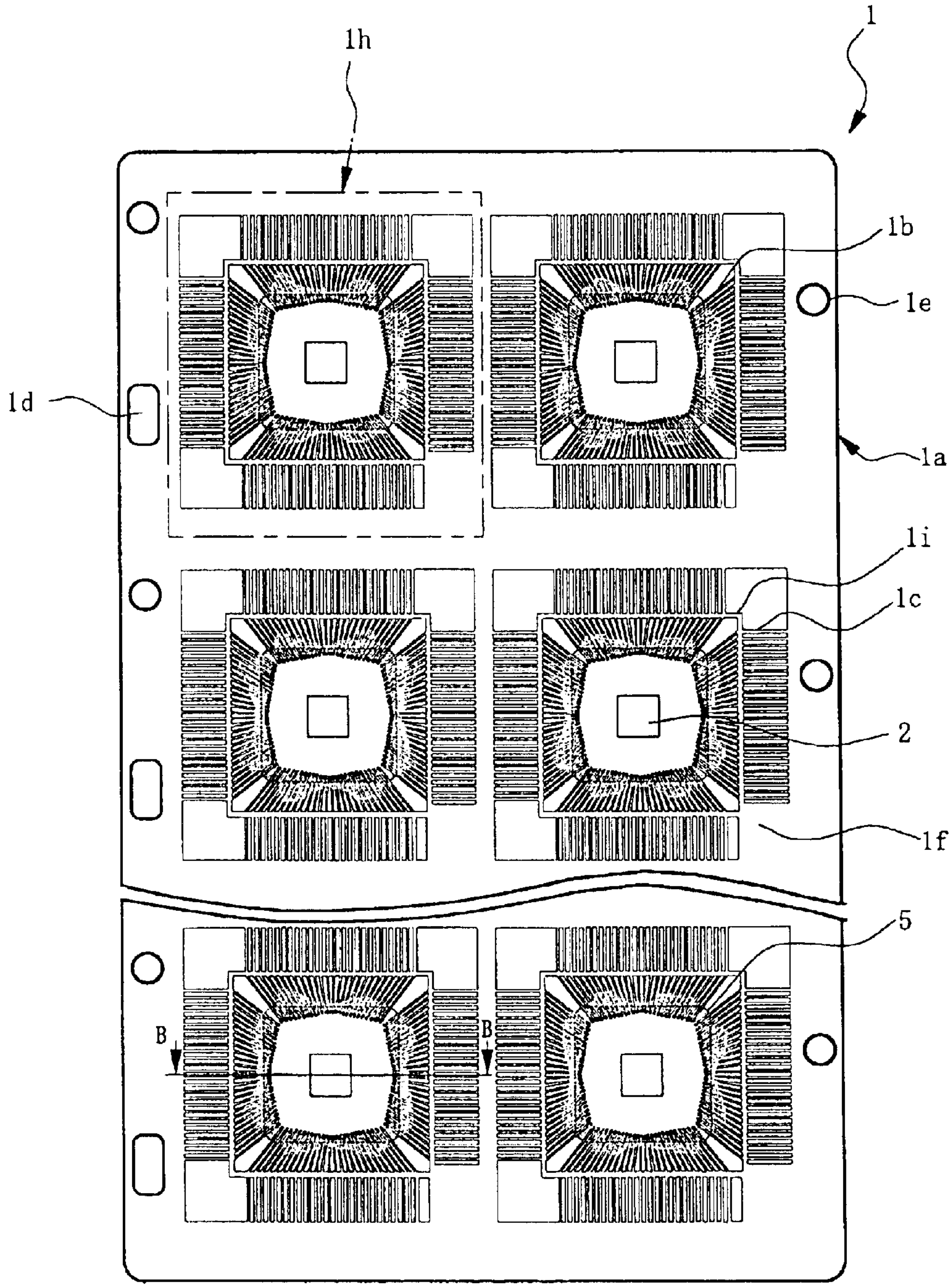
FIG. 6 is a partial plan view shown by partially cutting away one example of a construction formed after die bonding, in assembly of a semiconductor device using a matrix frame shown in FIG. 4.
Figure 7:
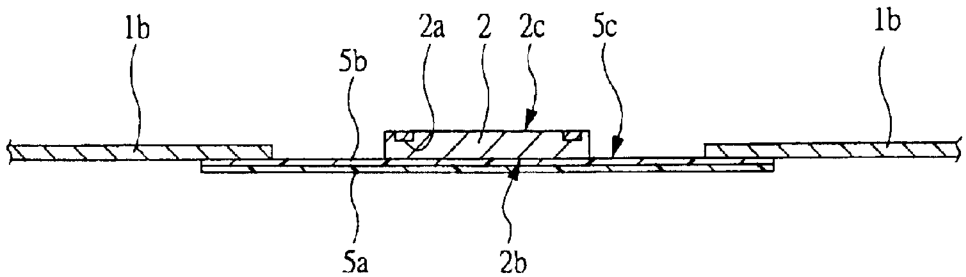
FIG. 7 is a partial enlarged cross-sectional view showing a construction having a cross section taken along line B—B in FIG. 6.
Figure 8:
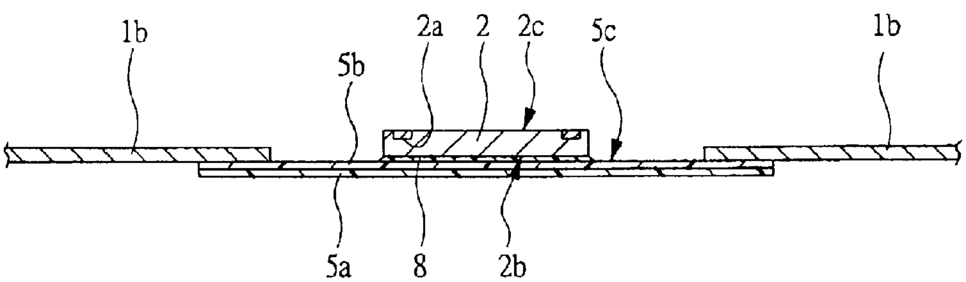
FIG. 8 is a partial enlarged cross-sectional view showing a construction formed after die bonding of a modified example of FIG. 7.
Figure 9:
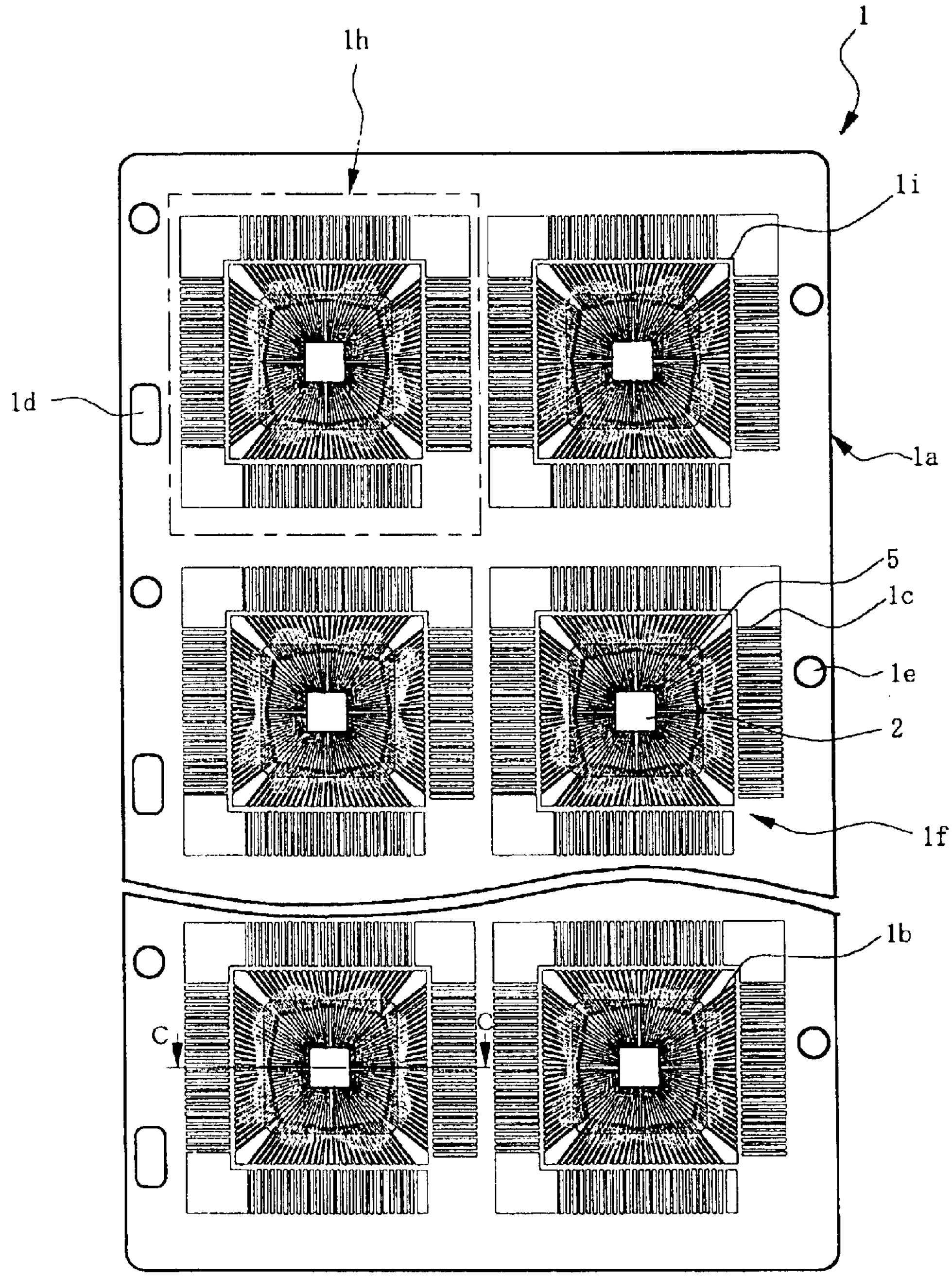
FIG. 9 is a partial plan view shown by partially cutting away one example of a construction formed after wire bonding, in assembly of a semiconductor device using a matrix frame shown in FIG. 4.
Figure 10:
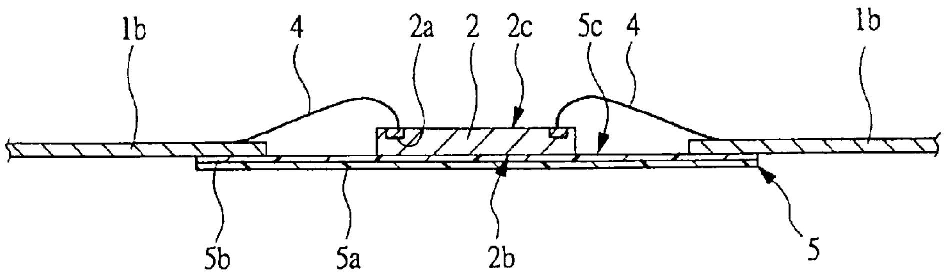
FIG. 10 is a partially enlarged cross-sectional view showing a structure having a cross section taken along line C—C in FIG. 9.
Figure 11:
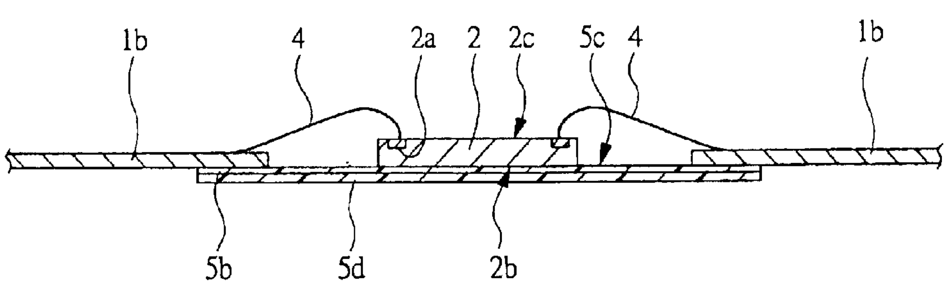
FIG. 11 is a partially enlarged cross-sectional view showing a construction formed after wire bonding of a modified example of FIG. 10.
Figure 12:
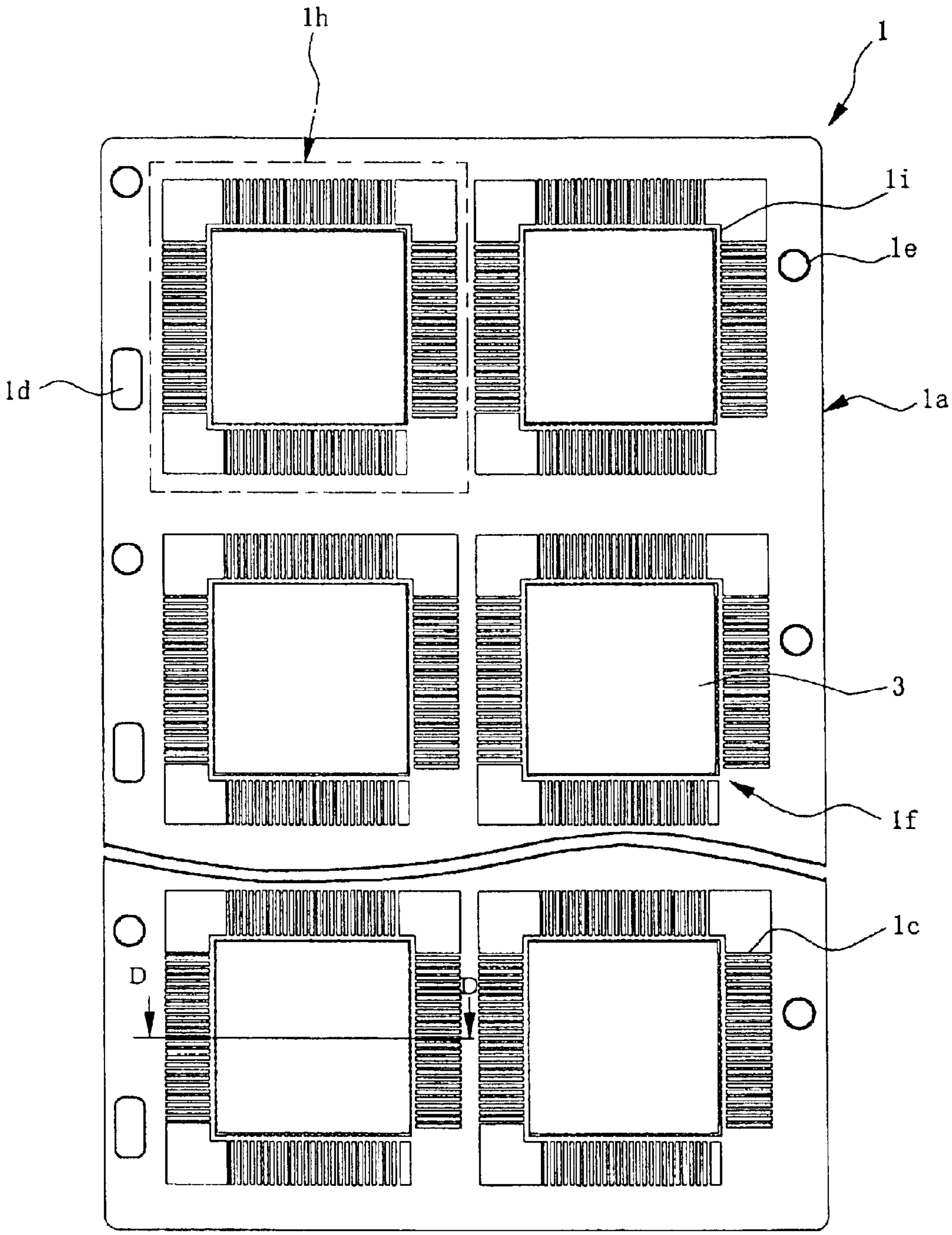
FIG. 12 is a partial plan view shown by partially cutting away one example of a construction formed after resin sealing, in assembly of a semiconductor device using a matrix frame shown in FIG. 4.
Figure 13:
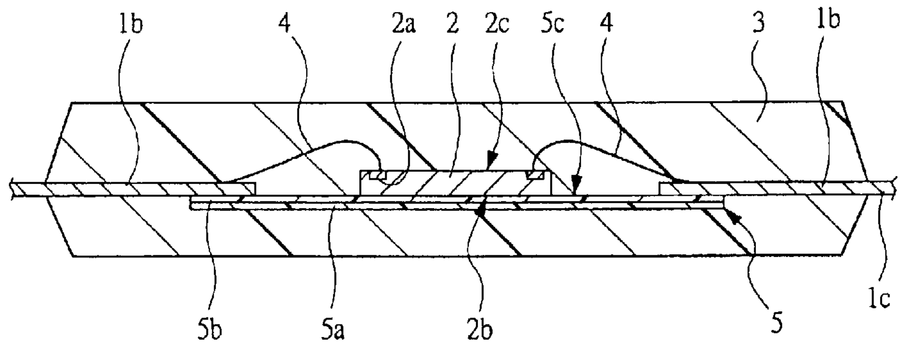
FIG. 13 is a partially enlarged cross-sectional view showing a structure having a cross section taken along line D—D in FIG. 12.
Figure 14:
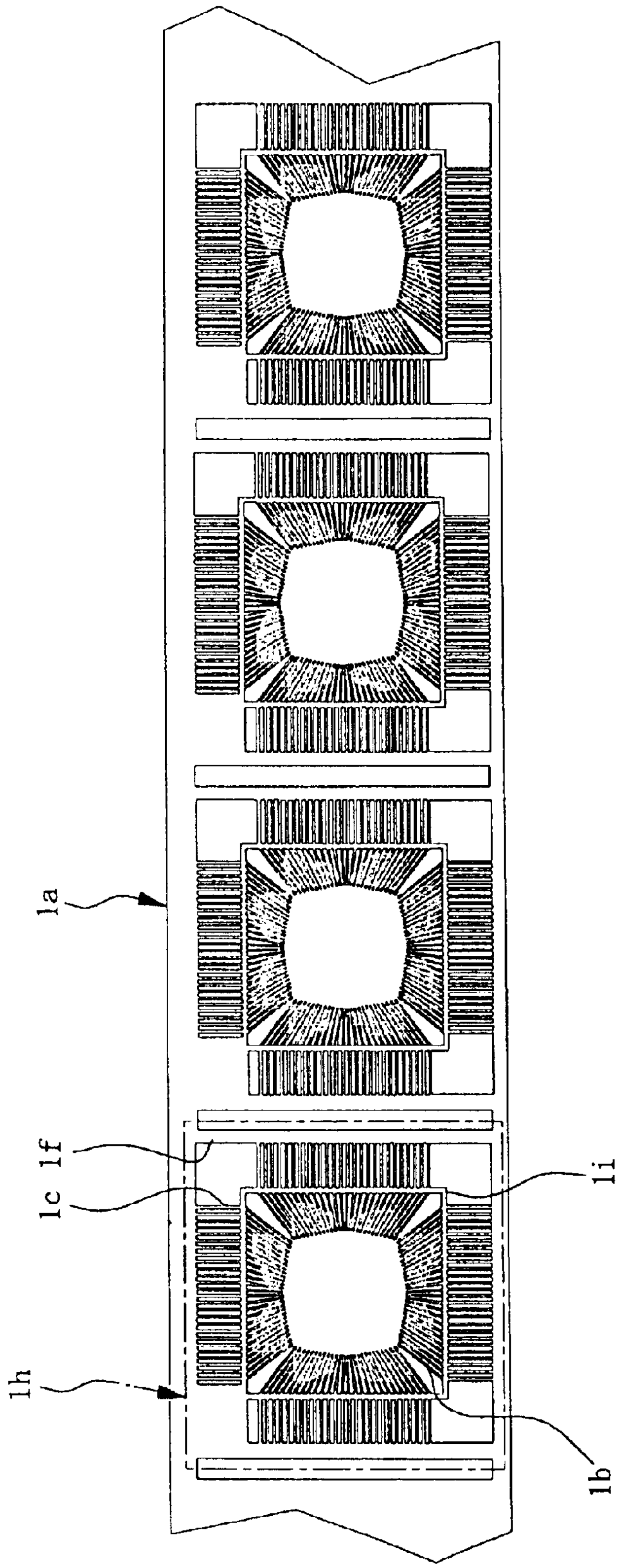
FIG. 14 is a partial plan view showing one example of a construction of a frame body of a single line lead frame used for assembly of the semiconductor device shown in FIG. 1.
Figure 15:
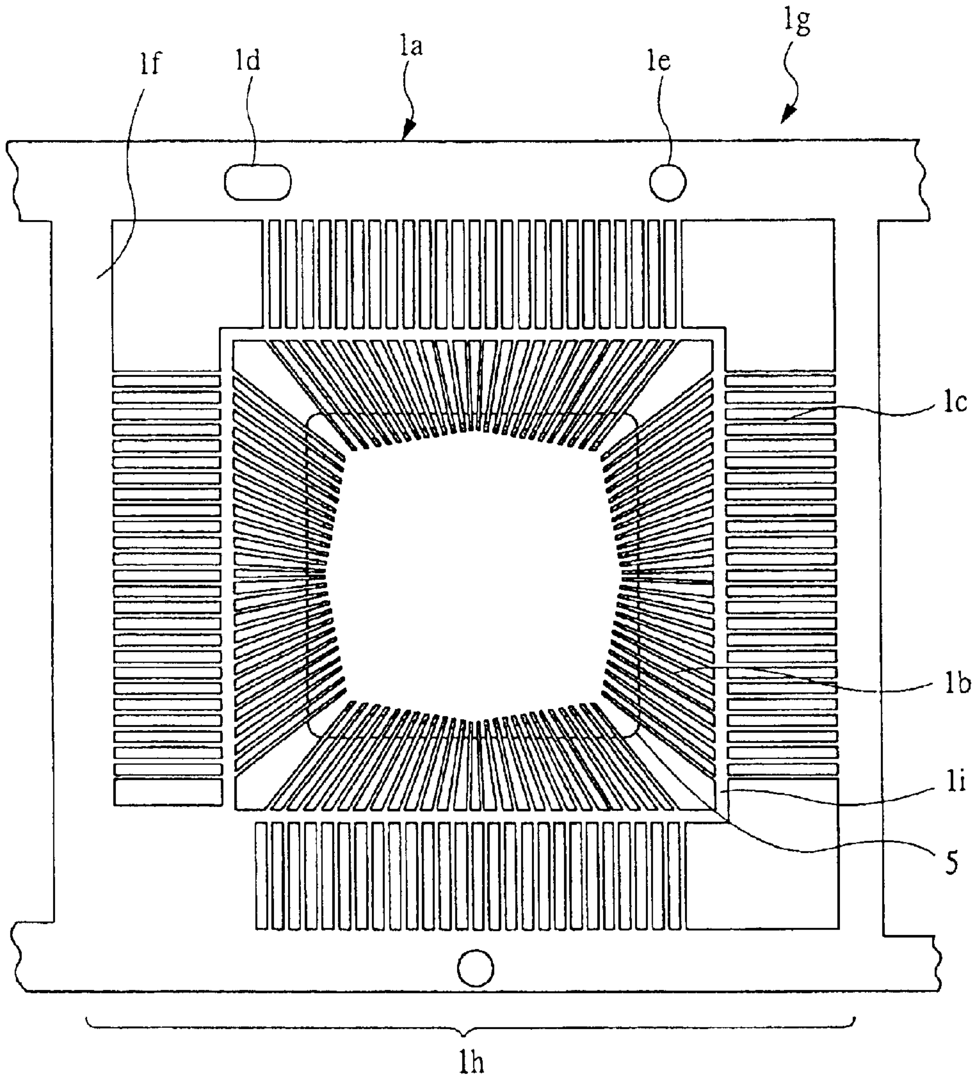
FIG. 15 is a partial enlarged plan view showing a construction of a single line lead frame fixing an insulating member in a frame body.
Figure 16:
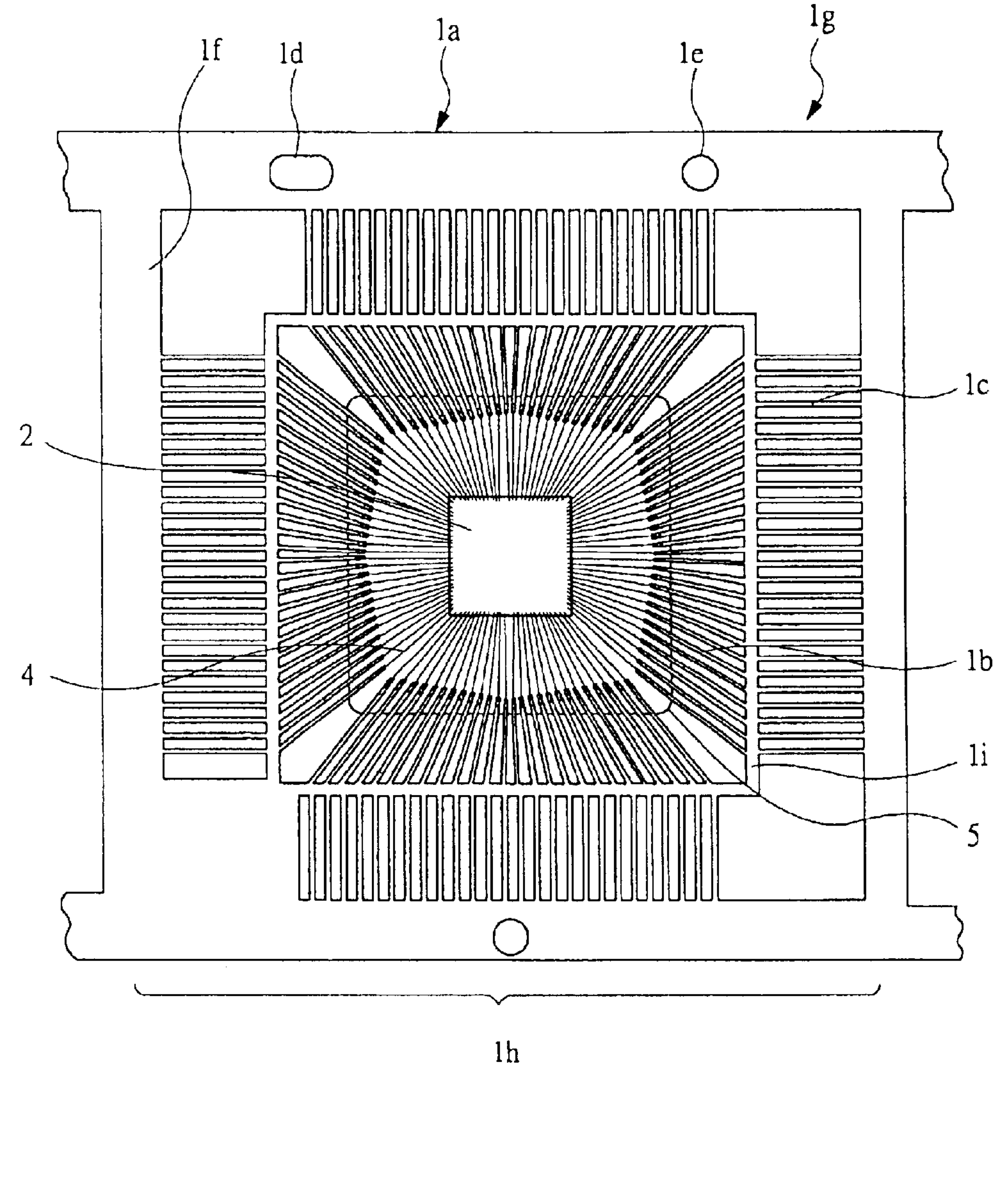
FIG. 16 is a partially enlarged plan view showing one example of a construction formed after wire bonding, in assembly of a semiconductor device using the single line lead frame shown in FIG. 15.
Figure 17:
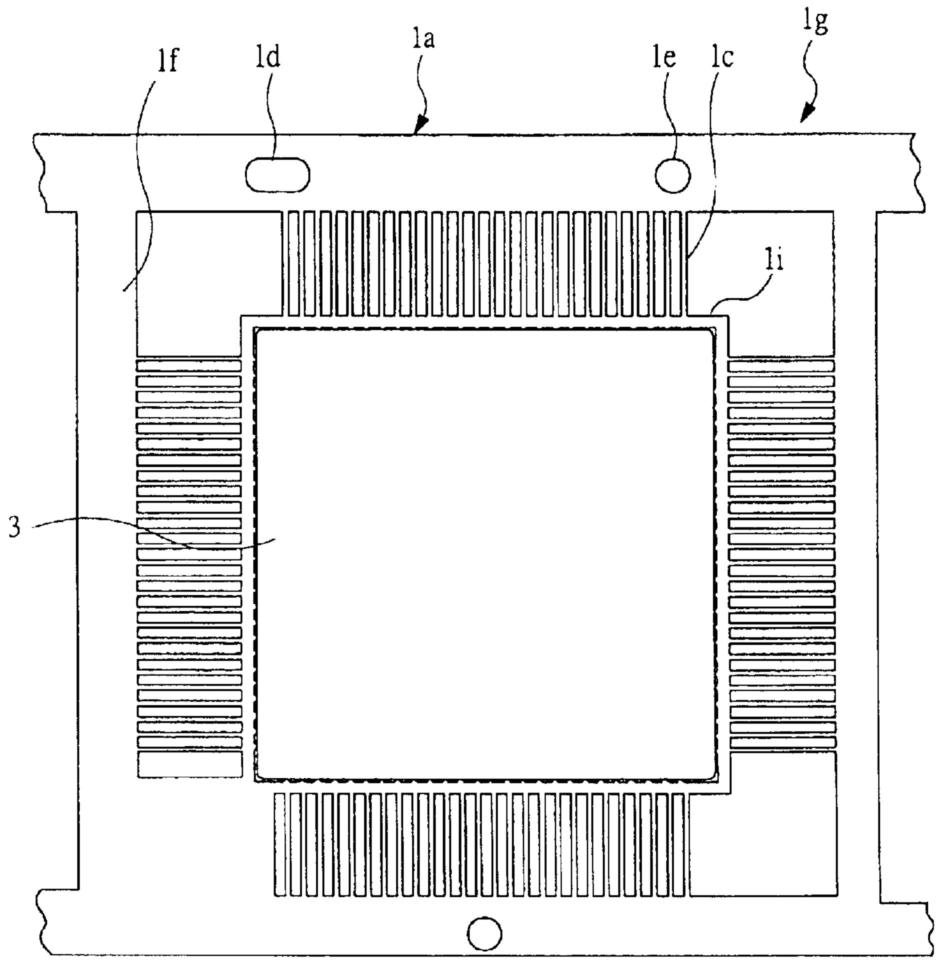
FIG. 17 is a partially enlarged plan view showing one example of a construction formed after resin sealing, in assembly of a semiconductor device using the single line lead frame shown in FIG. 15.
Figure 18:
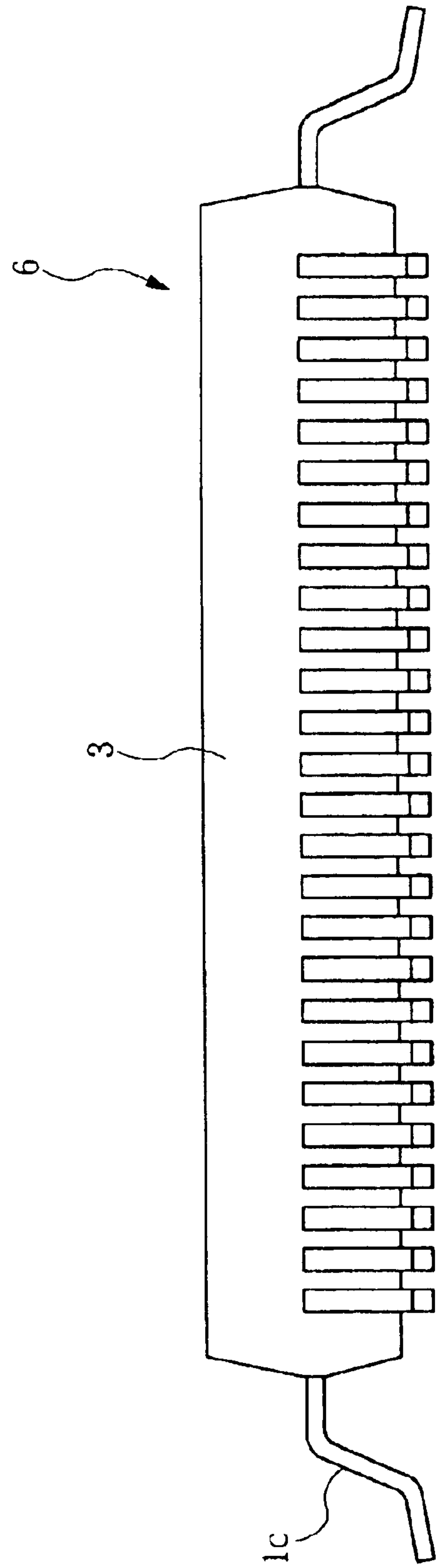
FIG. 18 is a side view showing one example of a construction formed after cutting and molding, in assembly of a semiconductor device using the single line lead frame shown in FIG. 15.
Figure 19:
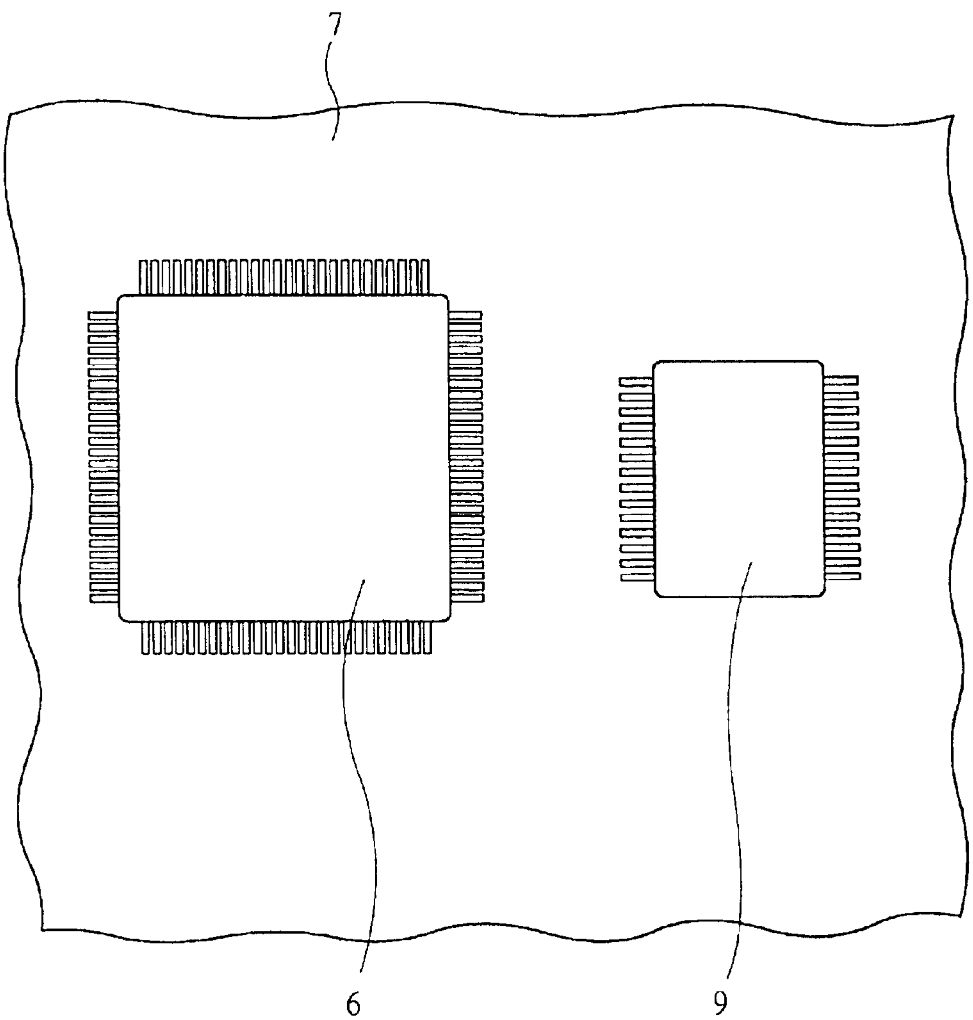
FIG. 19 is a partially enlarged plan view showing one example of a packaging state of the semiconductor device shown in FIG. 1 and the other semiconductor device.
Figure 20:
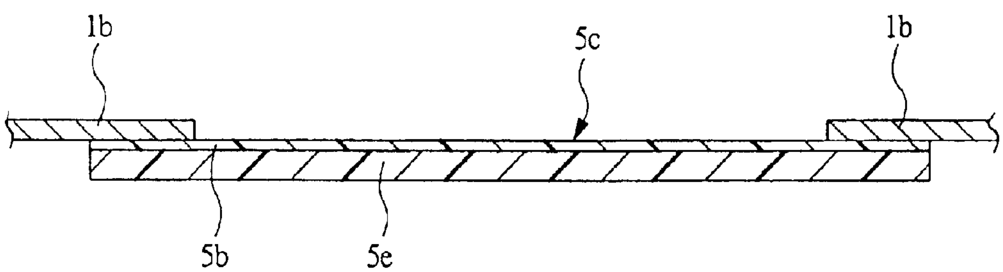
FIG. 20 is a partially enlarged cross-sectional view showing a construction of a modified example of FIG. 5.
Figure 21:
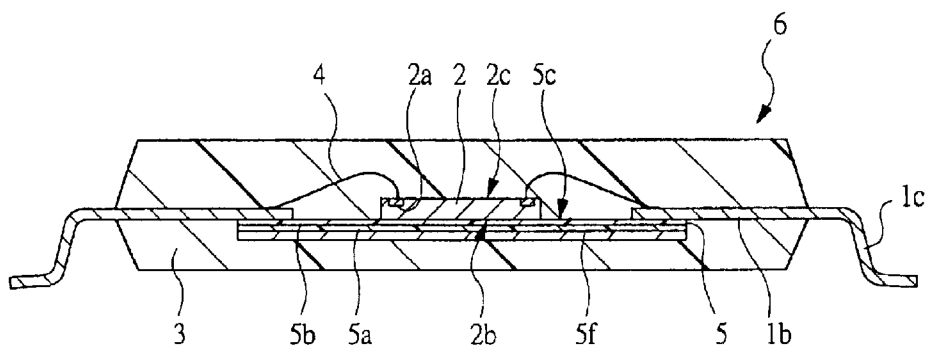
FIG. 21 is a cross-sectional view showing a construction of a semiconductor device of a modified example of Embodiment 1 that is the present invention.
Figure 22:
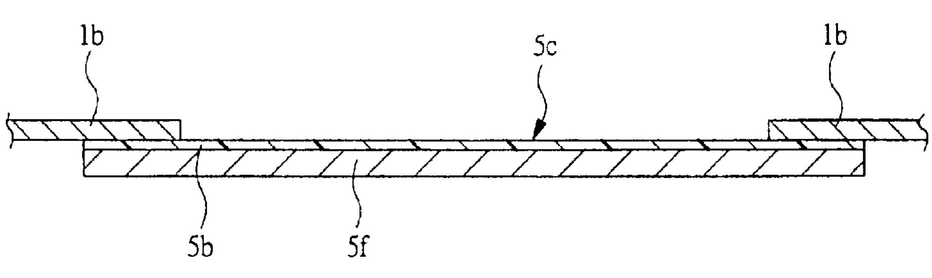
FIG. 22 is a cross-sectional view showing in detail a construction of a semiconductor device of the modified example shown in FIG. 21.
Figure 23:
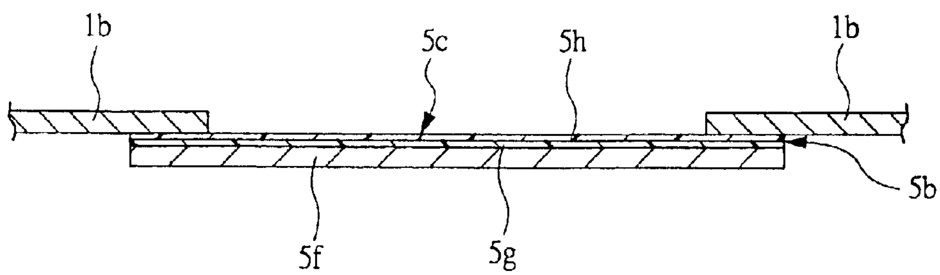
FIG. 23 is a cross-sectional view showing in detail a construction of a semiconductor device of the modified example shown in FIG. 21.
Figure 24:
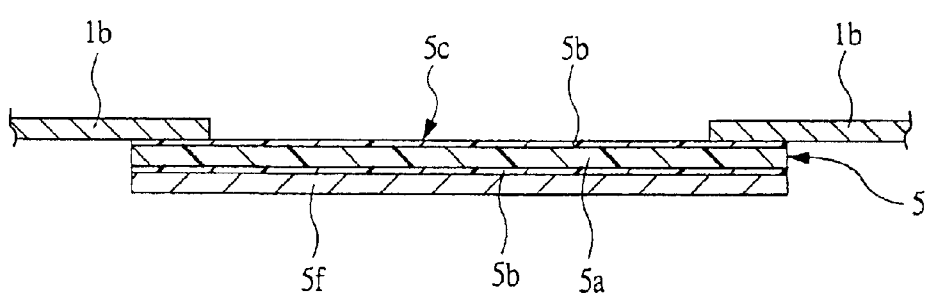
FIG. 24 is a cross-sectional view showing in detail a construction of a semiconductor device of the modified example shown in FIG. 21.
Figure 25A:
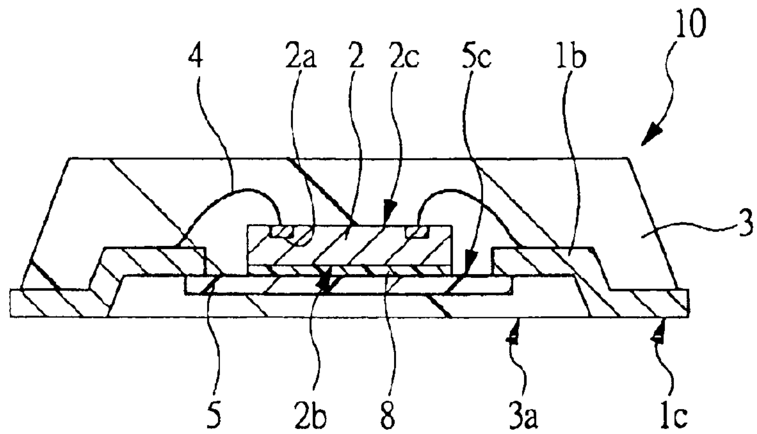
FIG. 25A is a view showing a construction of a QFN that is a semiconductor device of a modified example of Embodiment 1 which is the present invention, and is a cross-sectional view.
Figure 25B:
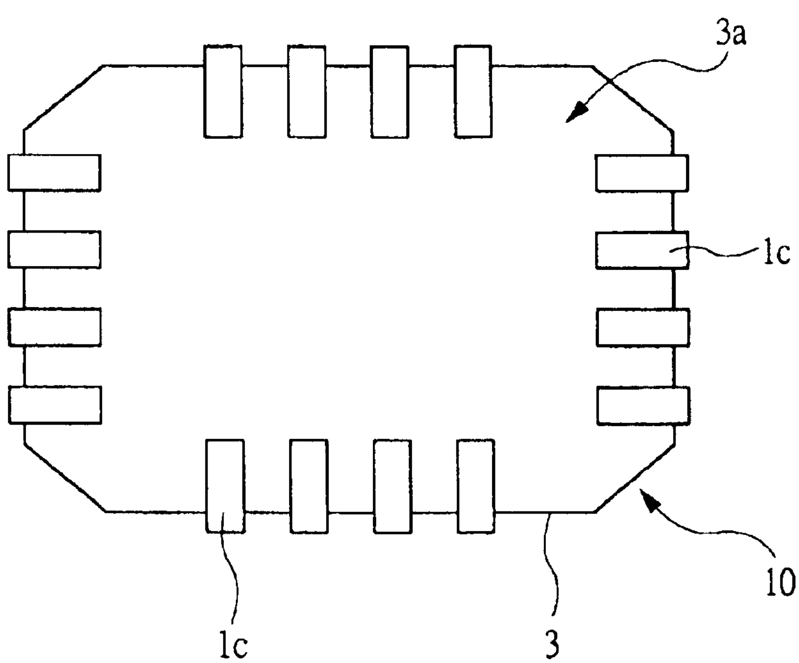
FIG. 25B are a view showing a construction of a QFN that is a semiconductor device of a modified example of Embodiment 1 which is the present invention, and is a bottom view.

FIGS. 1A and 1B are views showing one example of a construction of a semiconductor device that is Embodiment 1 of the present invention, wherein FIG. 1A shows a cross-sectional view and FIG. 1B shows a plan view. FIG. 2 is a partial plan view showing one example of a distance between a semiconductor chip and respective inner leads in the semiconductor device shown in FIG. 1. FIG. 3 is a partial enlarged plan view showing one example of a pad pitch between adjacent semiconductor chips and of a lead pitch between adjacent inner leads in the semiconductor device shown in FIG. 1. FIG. 4 is a partial plan view shown by partially cutting away one example of a construction of the matrix frame used for assembly of the semiconductor device shown in FIG. 1. FIG. 5 is a partially enlarged cross-sectional view showing a structure having a cross section taken along line A—A in FIG. 4. FIG. 6 is a partial plan view shown by partially cut away one example of a construction formed after die bonding, in assembly of the semiconductor device using the matrix frame shown in FIG. 4. FIG. 7 is a partially enlarged cross-sectional view showing a structure having a cross section taken along line B—B in FIG. 6. FIG. 8 is a partially enlarged cross-sectional view showing a construction formed after die bonding of a modified example of FIG. 7. FIG. 9 is a partial plan view shown by partially cut away one example of a construction formed after wire bonding, in assembly of the semiconductor device using the matrix frame shown in FIG. 4. FIG. 10 is a partial cross-section view showing a construction having a cross section taken along line C—C in FIG. 9. FIG. 11 is a partially enlarged cross-sectional view showing a construction formed after wire bonding of a modified example of FIG. 10. FIG. 12 is a partial plan view shown by partially cut away one example of a construction formed after resin sealing, in assembly of the semiconductor device using the matrix frame shown in FIG. 4. FIG. 13 is a partially enlarged cross-sectional view showing a structure having a cross section taken along line D—D in FIG. 12. FIG. 14 is a partial plan view showing one example of a construction of a frame body of a single line lead frame used for assembly of the semiconductor device shown in FIG. 1. FIG. 15 is a partially enlarged plan view showing a construction of the single line lead frame fixing insulating members to the frame body of FIG. 14. FIG. 16 is a partially enlarged plan view showing one example of a construction formed after wire bonding, in assembly of the semiconductor device using the single line lead frame shown in FIG. 15. FIG. 17 is a partially enlarged plan view showing one example of a construction formed after resin sealing, in assembly of the semiconductor device using the single line lead frame shown in FIG. 15. FIG. 18 is a side view showing one example of a construction formed after cutting and molding, in assembly of the semiconductor device using the single line lead frame shown in FIG. 15. FIG. 19 is a partially enlarged plan view showing one example of each packaging state of the semiconductor device shown in FIG. 1 and another semiconductor device. FIG. 20 is a partially enlarged cross-sectional view showing a construction of a modified example of FIG. 5. FIG. 21 is a cross-sectional view showing a construction of a semiconductor device that is a modified example of Embodiment 1 in the present invention. FIG. 22 is a cross-sectional view showing the detailed construction of the semiconductor device that is the modified example shown in FIG. 21. FIG. 23 is a cross-sectional view showing the detailed construction of the semiconductor device that is the modified example shown in FIG. 21. FIG. 24 is a cross-sectional view showing the detailed construction that is the semiconductor device of the modified example shown in FIG. 21. FIGS. 25A and 25B show a construction of QFN of the semiconductor device that is the modified example of Embodiment 1 of the present invention, wherein FIG. 25A shows a cross-sectional view and FIG. 25B shows a bottom view.

The semiconductor device of Embodiment 1 incorporates a semiconductor chip that is a resin-sealed type and a surface-packaging type and is comparatively small in size and has a narrow pad pitch (for example, having a pad pitch of 80 μm or less). In Embodiment 1, as one example of this semiconductor device, a QFP (Quad Flat Package) 6 shown in FIG. 1 will be taken up for description.

Furthermore, the QFP 6 of Embodiment 1 is of a multiple pin type.

A basic constitution of the QFP 6 will be explained. As shown in FIGS. 1A and 1B, the QFP 6 comprises a plurality of inner leads 1*b*, a thin sheet-shaped insulating member, bonding wires 4, a seal portion 3 and a plurality of outer leads 1*c*. The plurality of inner leads 1*b* extend on a circumference of a semiconductor chip 2. The thin sheet-shaped insulating member supports the semiconductor chip 2 and is joined to an end portion of each of the inner leads 1*b*. The bonding wires 4 connect pads 2*a* formed on a main surface 2*a* of the semiconductor chip 2 as surface electrodes, and inner leads 1*b* corresponding to these, to one another. The seal portion 3 is formed by resin-sealing the semiconductor chip 2, the wires 4 and the above-mentioned insulating member. The plurality of outer leads 1*c* is outer terminals projecting from the seal portion 3 to the exterior directed by four directions. These outer leads 1*c* are processed to bend in gull-wing shape.

The above-mentioned insulating member is a tape substrate 5, for example, comprising a tape base 5*a* which is made of epoxy system and the like having insulating properties, and an adhesive layer 5*b* which has insulating properties and is made of thermoplastic resin and the like. The insulating member supports the semiconductor chip 2 at a chip supporting surface 5*c* thereof. An end portion of each of the inner leads 1*b* is fixed to the insulating member 5 by the adhesive layer 5*b*. Therefore, the QFP 6 has such a structure as to suppress wire flow or flapping of each inner lead 1*b* caused by flow of mold resin at the time of molding (resin sealing).

According to features of the QFP 6 that is Embodiment 1, not only each inner lead 1*b* is fixed by the thin sheet-shaped tape substrate 5 but also, as shown in FIG. 2, a length (a) of a shorter side on the quadrilateral main surface 2*c* of the semiconductor chip 2 is twice or less than twice a distance (b). The distance (b) is between the semiconductor chip 2 and a tip of each of inner leads 1*b* which are placed at the farthest location on each center line 6*a* (X-axis or Y-axis) extending along a plane direction of the QFP 6.

That is, a relationship between the shorter side length (a) of the semiconductor chip 2 and a clearance (b) from the semiconductor chip 2 to such the tip of inner leads 1*b* that the tip is farthest from the semiconductor chip 2, is $a \leqq 2b$.

Further, the relationship is preferably $b \leqq a \leqq 2b$.

By this, the multiple pins QFP 6 mounting the small semiconductor chip 2 having a narrow pad pitch can certainly have effects on suppression of the wire flow and the flapping inner leads 1*b*.

As a result, reliability of the QFP 6 can be improved.

In the QFP 6, since it is possible to mount the semiconductor chip 2 to the tap substrate 5 even if the semiconductor chip 2 is reduced in size, it is no longer necessary to prepare a lead frame such as a matrix frame 1 (see FIG. 4), single line lead frame 1*g* (see FIG. 15) and the like as corresponding to a chip size. As a result, it is possible to standardize the lead frame.

FIG. 3 shows a relationship between a pad pitch (P) of the semiconductor chip 2 which is mounted on the QFP 6 and has a narrow pad pitch, and a tip pitch (L) between such the inner leads 1*b* that a lead pitch between adjacent tips thereof is smallest (narrowest), in the QFP 6. The relationship is P≦L/2.

That is, because the pad pitch of the semiconductor chip 2 is less than or equal to ½of the minimum value of the tip pitch between the adjacent inner leads 1*b*, effectiveness of the QFP 6 mounting the semiconductor chip 2 having a narrow pad pitch can be enhanced.

The pad pitch (P) of the semiconductor chip 2 is, for example, 60 μm and the minimum value (L) of the tip pitch between the inner leads 1*b* is, for example, 180 μm. In this case, (P=60 μm)≦(L=180 μm)/2 is obtained.

In addition, the QFP 6 according to Embodiment 1 has the narrow pad pitch and has multiple pins. Then, the high effectiveness of the QFP 6 can be obtained in the case where a size of the seal portion in a plane direction is, for example, 20 mm×20 mm or more and the number of pins (the number of external terminals) is 176 or more.

However, the pad pitch (P), the minimum value (L) of the tip pitch between the inner leads 1*b*, the size of the seal portion 3 in the plane direction, the number of pins, and the like are not be limited to the above-mentioned numerical values.

In the semiconductor chip 2, desired semiconductor integrated circuits are formed on the main surface 2*c* thereof. The pads 2*a* formed on this main surface 2*c* and the inner leads 1*b* corresponding thereto are connected by the wires 4, respectively. And, the outer leads 1*c* linked to the inner leads 1*b* are outputted to the outside thereof as external terminals of the QFP 6, respectively.

Consequently, signals between the semiconductor chip 2 and the outer leads 1*c* are transmitted via the wires 4 and the inner leads 1*b*.

The wires 4 are, for example, gold wires.

Further, the inner leads 1*b* and the outer leads 1*c* are, for example, iron-Ni alloys, copper alloys or the like.

The seal portion 3 is formed by performing the molding (resin-sealing), for example, using epoxy system thermosetting resin and the like, and thereafter thermo-hardening this.

Next, an explanation will be made of a manufacturing method of the QFP 6 of Embodiment 1.

As a lead frame used in the manufacturing method of the QFP 6, first of all, the case of use of a matrix frame 1 shown in FIG. 4 will be described.

First, a matrix frame 1 shown in FIG. 4 is prepared in which a plurality of package areas 1*h* is formed in a matrix arrangement. Each of the plurality of package areas 1*h* comprises a plurality of inner leads 1*b*, a thin sheet-shaped tape substrate 5 (an insulating member) joined to respective end portions of the inner leads 1*b* and being capable of supporting a semiconductor chip 2, and a plurality of outer leads 1*c* linked to the inner leads 1*b*.

That is, the matrix frame 1 is prepared, in which the tap substrate 5 as shown in FIG. 5 is fitted in each package area 1*h* of a frame body 1*a* made of iron-Ni alloys, copper alloys and the like.

For example, the tape substrate 5 is prepared by applying adhesives of thermosetting resin to the tape base 5*a* and thereby forming the adhesive layer 5*b*. In each package area 1*h* of the matrix frame 1, the respective end portions of the inner leads 1*b* and the tape substrate 5 are fixed via the adhesive layer 5*b* by a thermo-compression method.

At this time, the adhesive layer 5*b* is formed throughout entire of a surface of an inner lead arrangement side, that is, of a chip supporting surface 5*c* in the tape substrate 5. By this adhesive layer 5*b*, the respective inner leads 1*b* and the tape substrate 5 are joined to one another.

By this, the matrix frame 1 shown in FIG. 4 is formed.

In one piece of the matrix frame 1, the package areas 1*h* corresponding to one piece of the QFP 6 are formed in a matrix arrangement. In each of the package areas 1*h*, the tape base 5*a* is joined to the respective end portions of the inner leads 1*b* via the adhesive layer 5*b* having insulating properties.

Additionally, in each of the package areas 1*h*, the plurality of inner leads 1*b*, outer leads 1*c* and a dam bar 1*i* are arranged, respectively. The plurality of inner leads 1*b* extends in four directions around the tape substrate 5. The outer leads 1*c* are linked to and integrally formed with the respective inner leads as outer terminals. The dam bar 1*i* prevents mold resin from flowing during molding. A frame section 1*f* of the frame body 1*a* supports the respective outer leads 1*c*.

Further, this frame section 1*f* has longitudinal holes 1*d* for guides and positioning holes 1*e* formed for conveying the matrix frame 1 during die bonding or wire bonding.

Thereafter, as shown in FIG. 6 and FIG. 7, in each package area 1*h*, die-bonding (also called pellet bonding or chip mount) is carried out for mounting the semiconductor chip 2 to the chip supporting surface 5*c* of the tape substrate 5.

That is, a rear surface 2*b* of the semiconductor chip 2 and the chip supporting surface 5*c* of the tape substrate 5 are fixed to each other.

At this time, the semiconductor chip 2 may be fixed by the adhesive layer 5*b* of the tape substrate 5 as shown in FIG. 7, or may be fixed by resin paste 8 such as silver paste and the like as shown in the modified example of FIG. 8

In the tape substrate 5 of each package area 1*h*, the semiconductor chip 2 is mounted on the surface of the inner lead arrangement side of the tape substrate 5, and is mounted such that a length of a shorter side of the main surface of the quadrilateral semiconductor chip 2 is less than or equal to a distance between the semiconductor chip 2 and a tip of an inner lead which is placed on the center line 6*a* of the QFP 6 in the plane direction and at such a location that the tip thereof is farthest from the center line 6*a*.

That is, a relationship described above is $a \leqq 2b$ as shown in FIG. 2.

The semiconductor chip 2 to be incorporated in the QFP 6 of Embodiment 1 has a small size, wherein a pad pitch thereof is a narrow pad pitch, for example, of less than 80 μm and, preferably, 60 μm or less.

Thereafter, as shown in FIG. 9 and FIG. 10, the pads 2*a* of the semiconductor chip 2 and the inner leads 1*b* corresponding thereto are connected to one another by wire bonding.

That is, by using bonding wires 4 such as gold wires and the like, wire bonding is carried out. By this wire bonding, wires 4 connect the pads 2*a* and the inner leads 1*b* corresponding thereto, respectively.

A modified example shown in FIG. 11 is the case of use of a glass-containing epoxy substrate 5*d* as an insulating member.

After completion of wire bonding, the semiconductor chip 2, the wires 4, the respective inner leads 1*b* and the tape substrate 5 are resin-sealed by the molding method, and the seal portion 3 is formed as shown in FIG. 12 and FIG. 13.

The mold resin used for the above-mentioned molding is, for example, epoxy system thermosetting resin and the like.

After completion of resin sealing, one hundred and seventy-six outer leads 1*c* protruding from the seal portion

3 are cut and separated by using the cutting mold dies (not illustrated) or the like from the frame portion 1*f* of the frame body 1*a* of the lead frame 1. Then, as shown in FIG. 1A, the respective outer leads 1*c* are bent and formed in a gull-wing shape.

By this, the QFP 6 (a semiconductor device) shown in FIG. 1 can be manufactured.

Subsequently, by using a single line lead frame 1*g* shown in FIG. 15 as a lead frame, description will be made of the case of manufacturing of the QFP 16.

The single-row lead frame 1*g* is formed by arranging a plurality of package areas 1*h* shown in FIG. 14 in a line and linking one thereof to the other. Each of the plurality of package areas 1*h* comprises a plurality of inner leads 1*b*, the tape substrate 5 which is a thin sheet-shaped insulating member joined to respective end portions of the inner leads 1*b* and being capable of supporting the semiconductor chip 2, a plurality of outer leads 1*c* linked to the inner leads 1*b*.

That is, similarly to the case of the matrix frame 1 shown in FIG. 4, the tape substrate 5 is fixed in each of the package areas 1*h* of the frame body 1*a* which is shown in FIG. 14 and is formed by linking in a line to one another each of the plurality of package areas 1*h* comprising the plurality of inner leads 1*b*and the plurality of outer leads 1*c* linking thereto.

Thereafter, by procedures similar to a manufacturing method using the matrix frame 1, die bonding and wire bonding are carried out to achieve a condition shown in FIG. 16.

Further, resin sealing is carried out by molds to achieve a condition shown in FIG. 17. Thereafter, cutting and shaping is carried out to obtain the QFP 6 shown in FIG. 18.

The completed QFP 6, as shown in FIG. 19, can be mounted on the same packaging substrate 7 together with a SOP (Small Outline Package) 9, other electronic parts or the like by, for example, solder reflow and the like. The SOP is the other semiconductor package.

Next, description will be made of modified examples of Embodiment 1 shown in FIG. 20 through FIG. 25.

FIG. 20 is an example using a ceramic substrate 5*e* as a thin sheet-shaped insulating member, where the ceramic substrate 5*e* and the respective inner leads 1*b* are joined by the adhesive layer 5*b*. Even using the ceramic substrate 5*e* can achieve the same effects as using the tape substrate 5.

The QFP 6 shown in FIG. 21 has a construction in which a metal sheet 5*f* is fixed on a surface opposite to a surface (a chip supporting surface 5*c*) of the inner lead arrangement side of an insulating member such as the tape substrate 5 or the like. FIG. 22 through FIG. 24 shows the specific examples.

FIG. 22 shows the case in which the adhesive layer 5*b* is used as an insulating member.

That is, the adhesive layer 5*b* is formed by applying insulating adhesive on one surface of the metal sheet 5*f*, and the inner leads 1*b* and the metal sheet 5*f* are joined via this adhesive layer 5*b*.

FIG. 23 shows the adhesive layer 5*b* having a double-layer system comprising a hard adhesive layer 5*g* and a soft adhesive layer 5*h*. The soft adhesive layer 5*h* joins each of the inner leads 1*b* and the hard adhesive layer 5*g*. The hard adhesive layer 5*g* prevents each of the inner leads 1*b* from piercing through to a side of the metal sheet 5*f* due to burrs thereof.

Further, FIG. 24 shows the adhesive layers 5*b* formed on both front and rear surfaces of the tape base 5*a*. By this, the respective inner leads 1*b* and the tape base 5*a* are joined to one another, and the tape base 5*a* and the metal sheet 5*f* are joined to each other.

The case of the modified examples shown in FIG. 21 to FIG. 24 can have effects similar to those obtained by the case of use of the tape substrate 5 shown in FIG. 1, and additionally improve heat radiation properties of the QFP 6 by fixing the metal sheet 5*f*.

A modified example shown in FIGS. 25A and 25B relates to the case where the semiconductor device is QFN (Quad Flat Non-leaded Package) 10. The semiconductor device of Embodiment 1 can achieve objects thereof even if the semiconductor device is the QFN 10.

The QFN 10 has a construction in which, as shown in FIG. 25B, the outer leads 1*c* that become external terminals are arranged on a peripheral edge portion of the rear surface 3*a* of the seal portion 3, and which, as shown in FIG. 25A, an insulating member such as the tape substrate 5 and the like (a ceramic substrate 5*e*, a glass-containing epoxy substrate 5*d*, and the like may be acceptable) is fixed at respective end portions of the inner leads 1*b*, and which the semiconductor chip 2 is fixed on the chip supporting surface 5*c*.

Even in this QFN 10, the relationship between the semiconductor chip 2 and the respective inner leads 1*b* is the same as the relationship shown in FIG. 2. Or, the QFP 10 can have the same effects as the QFP 6 shown in FIG. 1 by setting conditions of both the pad pitch and the tip pitch of the inner leads 1*b* as shown in FIG. 3, in addition to this relationship.

(Embodiment 2)

Figure 26:
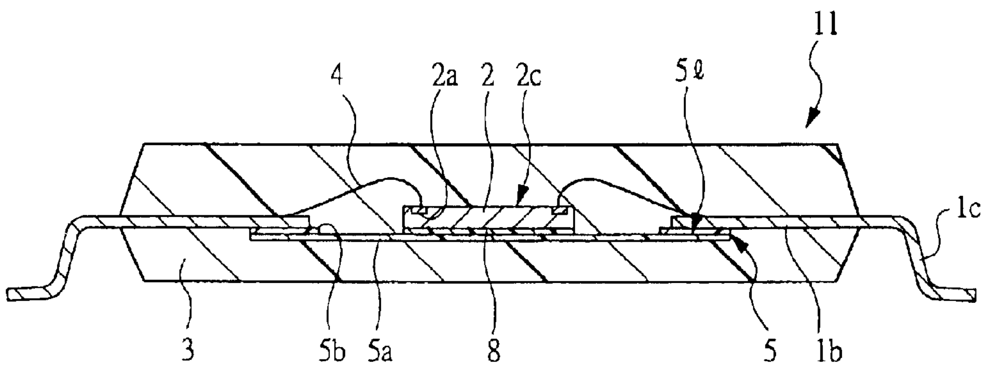
FIG. 26 is a cross-sectional view showing one example of a construction of a semiconductor device of Embodiment 2 that is the present invention.
Figure 27:
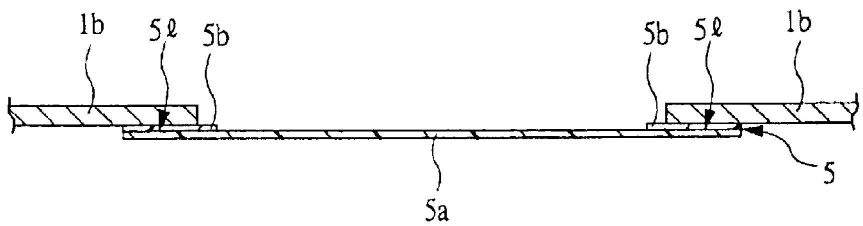
FIG. 27 is a partial cross-sectional view showing one example of a construction of a lead frame used for assembly of the semiconductor device shown in FIG. 26.
Figure 34:
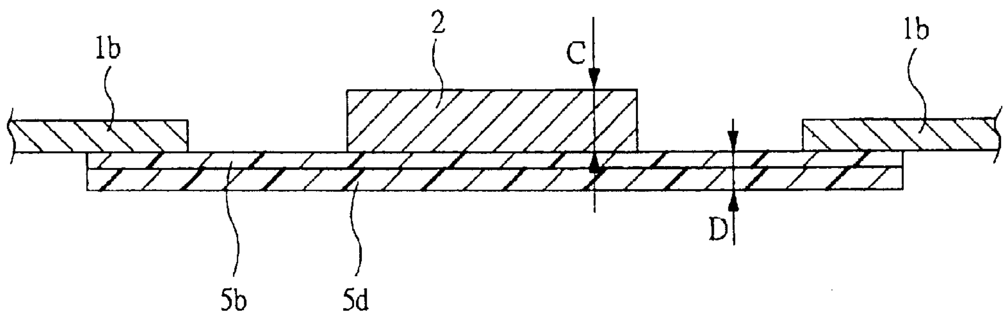
FIG. 34 is a partial cross-sectional view showing one example of a thickness relationship between a semiconductor chip, an insulating member, and an adhesive layer when the semiconductor chip is mounted to the insulating member of a lead frame of Embodiment 2 that is the present invention.
Figure 35:
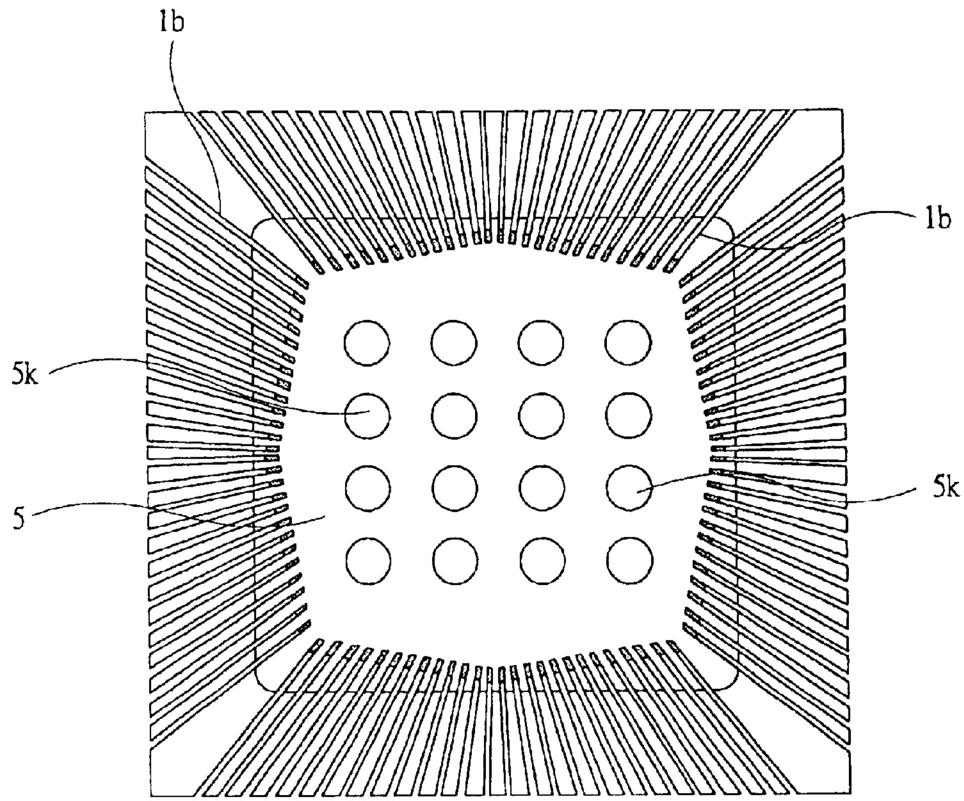
FIG. 35 is a partially enlarged plan view showing a construction of a lead frame of a modified example of Embodiment 2 that is the present invention.
Figure 36:
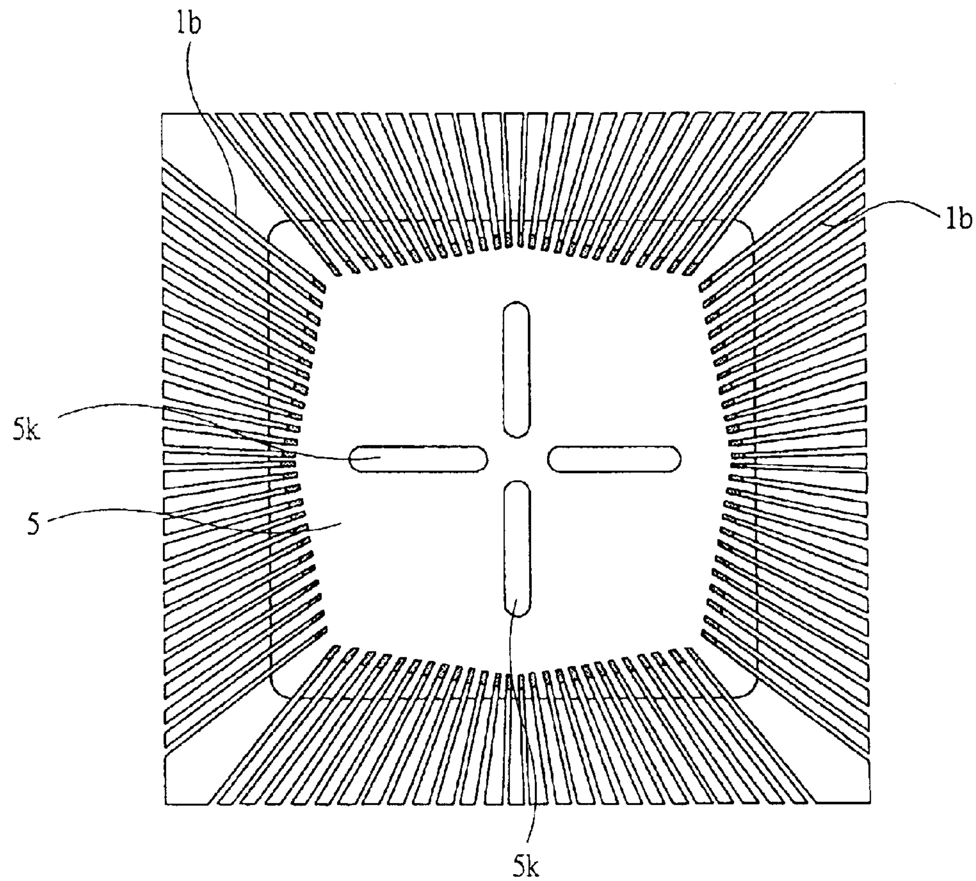
FIG. 36 is a partially enlarged plan view showing a construction of a lead frame of a modified example of Embodiment 2 that is the present invention.

FIG. 26 is a cross-sectional view showing one example of a construction of a semiconductor device that is Embodiment 2 of the present invention. FIG. 27 is a partial cross-sectional view showing one example of a construction of a lead frame used for assembly of the semiconductor device shown in FIG. 26. FIGS. 28 to 33 are partial cross-sectional views showing constructions of lead frames of modified examples that are Embodiment 2 of the present invention. FIG. 34 is a partial cross-sectional view showing one example of thickness relationships between a semiconductor chip, an insulating member, and an adhesive layer when the semiconductor chip is mounted to the insulating member of the lead frame that is Embodiment 2 of the present invention. FIG. 35 and FIG. 36 are partially enlarged plan views showing constructions of lead frames of modified examples that are Embodiment 2 of the present invention.

The semiconductor device of Embodiment 2 shown in FIG. 26 is a QFP 11 having a basic construction nearly similar to the QFP 6 of Embodiment 1, but does not include the conditions shown in FIG. 2 and FIG. 3 explained in Embodiment 1.

A basic construction of the QFP 11 comprises a plurality of inner leads 1*b*, thin sheet-shaped insulating member, resin paste 8, an adhesive layer 5*b*, bonding wires 4, a seal portion 3, and a plurality of outer leads 1*c*. The plurality of inner leads 1*b* extends on a circumference of the semiconductor chip 2. The thin sheet-shaped insulating member supports the semiconductor chip 2 and is joined to respective end portions of the inner leads 1*b*. The resin paste 8 joins the semiconductor chip 2 and the above-mentioned insulating member to each other. The adhesive layer 5*b* joins the respective inner leads 1*b* and the above-mentioned insulating member to one another. The bonding wire 4 connects pads 2*a* of the semiconductor chip 2 and the inner leads 1*b* corresponding thereto to one another. The seal portion 3 is formed by resin-sealing the respective wires 4 of the semiconductor chip 2 and the above-mentioned insulating member. The plurality of outer leads 1*c* is linked to the inner leads 1*b* and is exposed from the seal portion 3, respectively.

The features of the QFP 11 that is Embodiment 2 are that a forming place of the adhesive layer 5*b*, and material or shape of the insulating member, and the like are varied.

First, in FIG. 27, the tape substrate 5 is used as the above-mentioned insulating member. In addition, the adhesive layer 5*b* is disposed only on a lead joining portion 5*l* of a surface of an inner lead arrangement side of the tape substrate 5 to which the inner lead is arranged, and a tape base 5*a* of the tape substrate 5 and the respective inner leads 1*b* are joined by the adhesive layer 5*b*.

By this configuration, amount of adhesives for forming the adhesive layer 5*b* can be reduced, and reduction of the manufacturing cost can be achieved.

Figure 28:
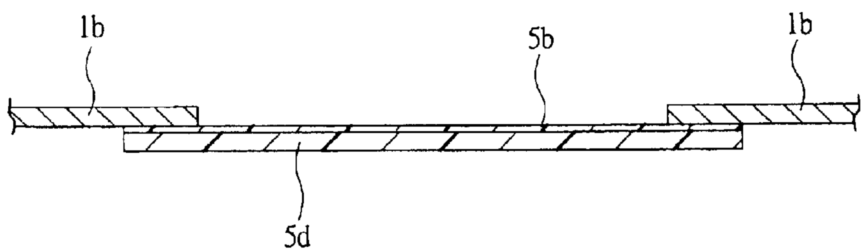
FIG. 28 is a partial cross-sectional view showing a construction of a lead frame of a modified example of Embodiment 2 that is the present invention.
Figure 29:
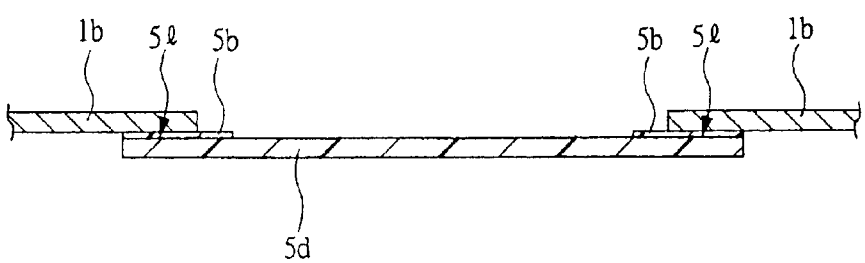
FIG. 29 is a partial cross-sectional view showing a construction of a lead frame of a modified example of Embodiment 2 that is the present invention.

FIG. 28 shows the case of use of a glass-containing epoxy substrate 5*d* as the above-mentioned insulating member. FIG. 29 shows the case where the adhesive layer 5*b* is disposed only on the lead joining portion 5*l* of the surface of the inner lead arrangement side of the glass-containing epoxy substrate 5*d* when the glass-containing epoxy substrate 5*d* is used as the above-mentioned insulating member.

In FIG. 28 and FIG. 29, the glass-containing epoxy substrate 5*d* and the respective inner leads 1*b* are joined by the adhesive layer 5*b*.

Figure 30:
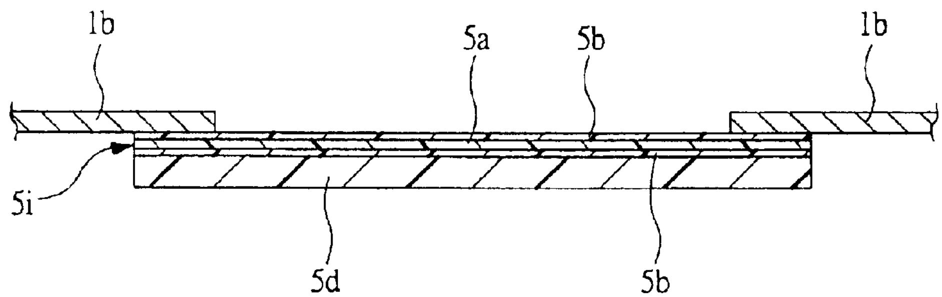
FIG. 30 is a partial cross-sectional view showing a construction of a lead frame of a modified example of Embodiment 2 that is the present invention.
Figure 31:
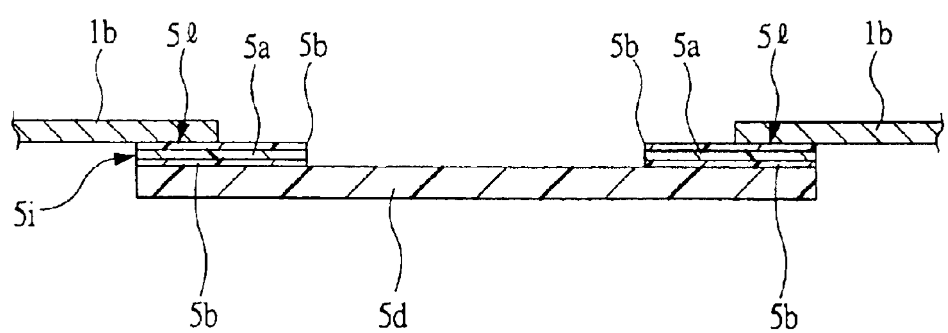
FIG. 31 is a partial cross-sectional view showing a construction of a lead frame of a modified example of Embodiment 2 that is the present invention.

FIG. 30 and FIG. 31 show the case where the glass-containing epoxy substrate 5*d* is used as the insulating member. The glass-containing epoxy substrate 5*d* and the respective inner leads 1*b* are joined by the adhesive layer 5*b* of pressure sensitive adhesive double coated tape 5*i* having the tape base 5*a*, on both front and rear surfaces whose the adhesive layer 5*b* is deposited.

At this time, FIG. 30 shows the case where the pressure sensitive adhesive double coated tape 5*i* is disposed throughout the entire surface (chip supporting surface 5*c*) of the inner lead arrangement side of the glass-containing epoxy substrate 5*d*. FIG. 31 shows the case where the pressure sensitive adhesive double coated tape 5*i* is disposed only on the lead joining portion 5*l* of the respective inner leads 1*b*.

Figure 32:
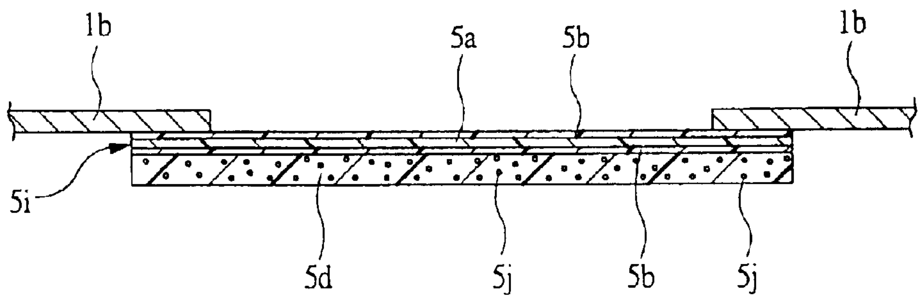
FIG. 32 is a partial cross-sectional view showing a construction of a lead frame of a modified example of Embodiment 2 that is the present invention.
Figure 33:
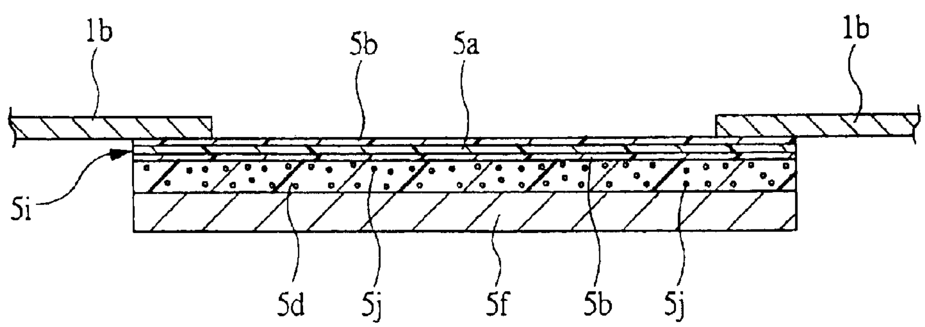
FIG. 33 is a partial cross-sectional view showing a construction of a lead frame of a modified example of Embodiment 2 that is the present invention.

FIG. 32 and FIG. 33 show cases where the above-mentioned insulating member is the glass-containing epoxy substrate 5*d* containing alumina particles 5*j*, and the glass-containing epoxy substrate 5*d* and the respective inner leads 1*b* are joined by the adhesive layer 5*b* of the pressure sensitive adhesive double coated tape 5*i*.

At this time, FIG. 32 shows the case where the pressure sensitive adhesive double coated tape 5*i* is disposed on the entire surface (chip supporting surface 5*c*) of the inner lead arrangement side of the glass-containing epoxy substrate 5*d*. FIG. 33 shows the case where the metal sheet 5*f* is fixed on a surface located in a side opposite to a joining side of the pressure sensitive adhesive double coated tape of the glass-containing epoxy substrate 5*d*.

By using the glass-containing epoxy substrate 5*d* containing the alumina particles 5*j* as the insulating member, it is possible to bring the thermal expansion coefficient of the glass-containing epoxy substrate 5*d* closer to that of silicon in the semiconductor chip 2 and improve heat radiation properties thereof. Moreover, as shown in FIG. 33, by fixing the metal sheet 5*f* thereon, the heat radiation properties can be further improved.

FIG. 34 shows such a construction that a thickness (C) of the semiconductor chip 2 is thicker than a total thickness (D) of the glass-containing epoxy substrate 5*d* and the adhesive layer 5*b* when the glass-containing epoxy substrate 5*d* is used as the insulating member (it may be the tape substrate 5.). A relationship between C and D is C>D.

By this construction, the heat conductivity thereof can be improved when the semiconductor chip 2 is die-bonded.

Further, since the thickness of the semiconductor chip 2 is greater than the total thickness of the adhesive layer 5*b* and the insulating member such as the glass-containing epoxy substrate 5*d*, it is possible to thin the above-mentioned insulating member in thickness and to thin and form the QFP 11 that is Embodiment 2 of the present invention.

As a result, the material cost can be reduced, and consequently, low cost of the QFP 11 can be attained.

In modified examples shown in FIG. 35 and FIG. 36, when the tape substrate 5 (may be glass-containing epoxy substrate 5*d*) is used as an insulating member, through-holes 5*k* of various shapes are formed in the tape substrate 5 and mold resin is embedded in the through-holes 5*k* for sealing resin.

FIG. 35 shows the case where a plurality of round through-holes 5*k* are provided in the tape substrate 5, and FIG. 36 shows the case where slender through-holes 5*k* are provided in a cross form.

By the constructions shown in FIG. 35 and FIG. 36, flapping of the respective inner leads 1*b* can be suppressed, and the wire flow can be also prevented, and, at the same time, and adhesion between mold resin and the tape substrate 5 can be enhanced, and the reliability of the QFP 11 can be improved.

Respective shapes and forming areas of the through-holes 5*k* of the tape substrate 5 are not particularly limited if they have such sizes (shapes) and areas that no wire flow is caused due to mold resin.

According to the QFP 11 of Embodiment 2, by joining the respective end portions of the inner leads 1*b* to the thin sheet-shaped insulating member such as a tape substrate 5, glass-containing epoxy substrate 5*d* and the like, it is possible suppress wire flow and/or flapping of respective inner leads due to flow of mold resin. As a result, the narrow pad pitch of the inner leads 1*b* can be achieved and, at the same time, disconnection of the respective wires 4 due to flapping of inner leads 1*b* can be prevented.

Further, joining the end portions of the respective inner leads 1*b* to the above-mentioned thin sheet-shaped insulating member, can suppress expansion and shrinkage in the vicinity of each tip of the inner leads 1*b* at the time of solder reflow generated by thermal expansion coefficient differences between mold resin and the respective inner leads 1*b*.

By this, disconnection generated at joining portions between the wires 4 and the inner leads 1*b* can be prevented. As a result, the reliability of the QFP 11 can be improved.

The QFP 11 has such a construction that the inner leads 1*b* each are fixed to the above-mentioned thin sheet-shaped insulating member (the glass-containing epoxy substrate 5*d*, the glass-containing epoxy substrate 5*d* including the alumina particles 5*j*, the tape substrate 5 or the like). Therefore, as compared to such a construction that the inner leads 1*b* each are fixed to a metal thin sheet such as a copper sheet and the like, the matrix frame 1 (see FIG. 4) or the single line lead frame 1*g* (see FIG. 15) to which the thin sheet-shaped insulating member is fixed can be made lighter and cost lower.

Further, the above-mentioned copper sheet has a thickness of about 120 $\mu$m and, at this time, the semiconductor device has a thickness of about 2.8 to 3 mm, whereas the above-mentioned thin sheet-shaped insulating member is formed so as to have a thickness of about 50 $\mu$m like Embodiment 2. Therefore, the QFP 11 assembled by using this can be made about 1 to 1.2 mm in thickness.

Consequently, according to Embodiment 2, the QFP 11 made light and thin and having multiple pins can be achieved.

The manufacturing method of the QFP 11 that is Embodiment 2 is the same as that of the QFP 6 described in Embodiment 1, and so the repetition thereof will be omitted.

As described above, the invention made by the present inventor have been specifically described in accordance with the embodiments of the present invention. But, needless to say, the present invention is not limited to the above-mentioned embodiments and can be variously modified and changed without departing from the gist thereof.

For example, in Embodiment 2 described above, the QFP 11 has been taken up as the semiconductor device for description, but, as the semiconductor device of Embodiment 2, outer leaders other than the outer leas 1*c* which the QFP 11 has may protrude in two directions.

The semiconductor device and the manufacturing method thereof of the present invention may be contents that combine Embodiment 1 with Embodiment 2.

Of the invention disclosed in the present application, effects obtained by the typical ones can be briefly described as follows.

(1) By joining the inner leads to the insulating member and setting the length of a shorter side of the main surface of the semiconductor chip twice or less than the distance from tips of inner leads arranged at the farthest location from the center lines of the semiconductor chip, to the semiconductor chip, it is possible to certainly attain effects on suppression of the wire flow and flopping of the inner leads caused by flow of the mold resin due to fixing of the inner leads to the insulating member. As a result, the reliability of the semiconductor device of a construction in which the inner leads are joined to the insulating member can be improved.

(2) By joining the inner leads to the insulating member and setting the length of a shorter side of the main surface of the semiconductor chip twice or less than the distance from tips of inner leads arranged at the farthest location from the center lines of the semiconductor chip, to the semiconductor chip, it is possible to mount the semiconductor chip to the insulating member even if the chip becomes small in size, and it is no longer necessary to prepare the lead frame per size of the chip. As a result, the lead frame can be standardized.

(3) It is possible to suppress the wire flow and/or the flapping of the inner leads caused by the flow of mold resin, by joining the respective end portions of the inner leads to the insulating member. As a result, the narrow pad pitch of the inner leads can be achieved and, at the same time, disconnection of the respective wires due to flapping of the inner leads can be prevented.

(4) It is possible to suppress expansion and shrinkage of the respective end portions of the inner leads at the time of solder reflow caused by thermal expansion coefficient differences between the mold resin and the respective inner leads, by joining the end portions of the inner leads to the insulating member. This can prevent disconnection generated at the joining section between the wires and the inner leads. As a result, the reliability of the semiconductor device can be improved.

(5) Because the semiconductor chip is thicker than a total of the insulating member and the adhesive layer in thickness, thermal conductivity at the die bonding can be improved.

(6) Because the semiconductor chip is thicker than a total of the insulating member and the adhesive layer in thickness, the thickness of the insulating member can be reduced and the semiconductor device can be formed in a thin shape. This can reduce the material cost and bring low cost of the semiconductor device.

What is claimed is:

1. A method of manufacturing a resin-sealing type semiconductor device, comprising the steps of:

preparing a multi-link lead frame formed by linking a plurality of package areas in a line, each of the package areas including a plurality of inner leads and a thin sheet-shaped insulating member joined to an end portion of each of said inner leads and capable of supporting a semiconductor chip;

thereafter mounting a semiconductor chip on said insulating member in each of said package areas on which said inner leads and said insulating member are joined;

connecting surface electrodes of said semiconductor chips and said inner leads corresponding thereto by respective wires;

forming a seal portion by resin-sealing said semiconductor chips, said wires, and said insulating members; and separating a plurality of outer leads exposed from said seal portion, from a frame section of said lead frame;

wherein said mounting step is performed such that a length of a shorter side of a main surface of said semiconductor chip formed in a quadrilateral shape is twice or less than twice a distance from a tip of the inner leads arranged at the farthest location from a center line of the semiconductor chip in a plane direction, to said semiconductor chip.

2. The method of manufacturing a semiconductor device according to claim 1, wherein said mounting is performed by step mounting said semiconductor chip on a surface of an inner lead arrangement side of said insulating member.

3. The method of manufacturing a semiconductor device according to claim 1, wherein said preparing step includes a step of providing an adhesive layer disposed throughout the entirety of a surface of an inner lead arrangement side of said insulating member.

4. The method of manufacturing a semiconductor device according to claim 1, wherein said preparing step includes a step of providing an adhesive layer disposed only on a lead joining portion of a surface of an inner lead arrangement side of said insulating member.

5. A method of manufacturing a resin-sealing type semiconductor device, comprising the steps of:

preparing a matrix frame by arranging a plurality of package areas in a matrix arrangement, each of the package areas including a plurality of inner leads and a thin sheet-shaped insulating member joined to an end portion of each of said inner leads and capable of supporting a semiconductor chip;

thereafter mounting a semiconductor chip on said insulating member in each of said package areas on which said inner leads and said insulating member are joined;

connecting surface electrodes of said semiconductor chips and said inner leads corresponding thereto by respective wires;

forming a seal portion by resin-sealing said semiconductor chips, said wires, and said insulating members; and separating a plurality of outer leads exposed from said seal portion, from a frame section of said matrix frame;

wherein said mounting step is performed such that a length of a shorter side of a main surface of said semiconductor chip formed in a quadrilateral shape is twice or less than twice a distance from a tip of the inner leads arranged at the farthest location from a center line of the semiconductor chip in a plane direction, to said semiconductor chip.

* * * * *